US010545820B2

United States Patent
Park

(10) Patent No.: US 10,545,820 B2
(45) Date of Patent: Jan. 28, 2020

(54) MEMORY DEVICE, MEMORY SYSTEM AND METHOD OF OPERATING THE SAME

(71) Applicant: SAMSUNG ELECTRONICS CO., LTD., Suwon-si, Gyeonggi-Do (KR)

(72) Inventor: Jong-Wook Park, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 215 days.

(21) Appl. No.: 15/154,277

(22) Filed: May 13, 2016

(65) Prior Publication Data

US 2016/0259684 A1 Sep. 8, 2016

Related U.S. Application Data

(63) Continuation of application No. 13/861,676, filed on Apr. 12, 2013, now Pat. No. 9,350,386.

(30) Foreign Application Priority Data

Mar. 15, 2013 (KR) .......................... 10-2013-0028241

(51) Int. Cl.
*G06F 11/10* (2006.01)
*H03M 13/09* (2006.01)
(Continued)

(52) U.S. Cl.
CPC ...... *G06F 11/1068* (2013.01); *G06F 11/1048* (2013.01); *G11C 29/52* (2013.01); *H03M 13/05* (2013.01); *H03M 13/09* (2013.01)

(58) Field of Classification Search
CPC ............ G06F 11/1076; G06F 11/1008; G06F 11/1068; G06F 11/1044; G06F 11/1048;
(Continued)

(56) References Cited

U.S. PATENT DOCUMENTS 5,347,648 A * 9/1994 Stamm ................. G06F 9/3836
711/E12.024
6,473,360 B2 * 10/2002 Ooishi ................. G11C 7/1072
365/189.05
(Continued)

FOREIGN PATENT DOCUMENTS

| JP | 2011-253251 | 12/2011 |
| JP | 3669103 | 4/2015 |
| KR | 10-0795545 | 1/2008 |

OTHER PUBLICATIONS

1st Office Action dated May 31, 2019 in Corresponding Korean Application No. 10-2013-0028241.

*Primary Examiner* — Albert Decady
*Assistant Examiner* — Enam Ahmed
(74) *Attorney, Agent, or Firm* — F. Chau & Associates, LLC

(57) ABSTRACT

A memory device, a memory system, and a method of operating the same. The memory device includes a memory cell array including a plurality of memory cells and a write command determination unit (WCDU) that determines whether a write command input to the memory device is (to be) accompanied a masking signal. The WCDU produces a first control signal if the input write command is (to be) accompanied by a masking signal. A data masking unit combines a portion of read data read from the memory cell array with a corresponding portion of input write data corresponding to the write command and generates modulation data in response to the first control signal. An error correction code (ECC) engine generates parity of the modulation data.

24 Claims, 24 Drawing Sheets

Related U.S. Application Data

(60) Provisional application No. 61/623,221, filed on Apr. 12, 2012.

(51) Int. Cl.
   *H03M 13/05* (2006.01)
   *G11C 29/52* (2006.01)

(58) Field of Classification Search
   CPC ..... H05K 999/99; G11C 29/52; H03M 13/05; H03M 13/09
   USPC .......................................... 714/763
   See application file for complete search history.

(56) References Cited

U.S. PATENT DOCUMENTS

| | | | |
|---|---|---|---|
| 6,976,204 B1 * | 12/2005 | Chambers | G06F 11/106 714/48 |
| 7,516,371 B2 * | 4/2009 | Sakaue | G06F 11/1068 714/52 |
| 8,086,936 B2 * | 12/2011 | Gower | G06F 11/1076 365/201 |
| 8,132,086 B2 * | 3/2012 | Park | G06F 11/1044 711/105 |
| 8,976,734 B2 | 3/2015 | Tong et al. | |
| 2001/0015927 A1 * | 8/2001 | Ooishi | G11C 7/1051 365/201 |
| 2001/0023496 A1 | 9/2001 | Yamamoto et al. | |
| 2002/0018389 A1 | 2/2002 | Ito et al. | |
| 2004/0078675 A1 | 4/2004 | Kootstra | |
| 2005/0169091 A1 * | 8/2005 | Miki | G11C 8/18 365/230.03 |
| 2005/0185524 A1 * | 8/2005 | Park | G11B 20/1252 369/30.3 |
| 2005/0268203 A1 | 12/2005 | Keays et al. | |
| 2006/0126472 A1 * | 6/2006 | Hwang | G11B 20/1217 369/53.17 |
| 2007/0226590 A1 * | 9/2007 | Nagai | G06F 11/1008 714/763 |
| 2009/0049455 A1 * | 2/2009 | Ito | G06F 1/3203 719/315 |
| 2010/0146368 A1 | 6/2010 | Chishti et al. | |
| 2010/0235714 A1 * | 9/2010 | Toda | G06F 11/106 714/763 |
| 2012/0144267 A1 * | 6/2012 | Yeh | G06F 11/1072 714/763 |
| 2013/0159644 A1 | 6/2013 | Lee | |
| 2013/0275830 A1 | 10/2013 | Park | |
| 2014/0317470 A1 * | 10/2014 | Chung | G06F 11/1076 714/764 |

\* cited by examiner

FIG. 4

| WCMD | Command Pin | | CAp# | | | | | | | | | | | CK EDGE |
|---|---|---|---|---|---|---|---|---|---|---|---|---|---|---|
| | CKp | /CS | CA0 | CA1 | CA2 | CA3 | CA4 | CA5 | CA6 | CA7 | CA8 | CA9 | |
| RMW Command | H | L | AP[3,4] | H | L | L | RFU | C1 | C2 | BA0 | BA1 | BA2 | ↑ |
| | | | C3 | C4 | C5 | C6 | C7 | C8 | C9 | C10 | C11 | ↓ |

FIG. 9

| WOMD | Command Pin | | CAp# | | | | | | | | | | CK EDGE |
|---|---|---|---|---|---|---|---|---|---|---|---|---|---|
| | CKp | /CS | CA0 | CA1 | CA2 | CA3 | CA4 | CA5 | CA6 | CA7 | CA8 | CA9 | |
| Normal Write Command | H | L | H | L | L | H | RFU | C1 | C2 | BA0 | BA1 | BA2 | ↑ |
| | | | AP[3,4] | C3 | C4 | C5 | C6 | C7 | C8 | C9 | C10 | C11 | ↑ |

FIG. 13

| WCMD | Command Pin | | | CAp# | | | | | | | | | | | CK EDGE |
|---|---|---|---|---|---|---|---|---|---|---|---|---|---|---|---|
| | CKp | /CS | RMW | CA0 | CA1 | CA2 | CA3 | CA4 | CA5 | CA6 | CA7 | CA8 | CA9 | |
| RMW Command | H | L | H | H | L | L | RFU | RFU | C1 | C2 | BA0 | BA1 | BA2 | ↑ |
| | | | | AP[3,4] | C3 | C4 | C5 | C6 | C7 | C8 | C9 | C10 | C11 | ↓ |

MEMORY DEVICE, MEMORY SYSTEM AND METHOD OF OPERATING THE SAME

CROSS-REFERENCE TO RELATED APPLICATIONS

This application is a Continuation of U.S. patent application Ser. No. 13/861,676, filed on Apr. 12, 2013, which claims the benefit of U.S. Provisional Application No. 61/623,221, filed on Apr. 12, 2012, in the United States Patent and Trademark Office, and claims priority under 35 U.S.C. § 119 to Korean Patent Application 10-2013-0028241 filed on Mar. 15, 2013, the disclosures of both of which are incorporated by reference herein in their entireties.

TECHNICAL FIELD

The inventive concept relates to a memory device, a memory system, and a method of operating the same, and more particularly, to a memory device, a memory system, and a method of operating the same, which can reduce response time for a command.

DISCUSSION OF THE RELATED ART

A conventional memory device or memory system of the related art having a data masking DM function may also implement an error correction circuit (ECC) on chip. A data masking signal may be input to the memory device in synchronization with the transmission of a portion of the write data to be masked in the memory device. To support high speed data processing, it is necessary for a memory device to process commands input to the memory device at high speed.

FIG. 15 is a timing diagram illustrating the operation of a conventional memory device or memory system of the related art. A comparative discussion of FIG. 15 is provided herein below.

SUMMARY

Aspects of inventive concept provide a memory device, a memory system, and a method of operating the same, that can reduce response time for a command. A method and structure for determining whether a write command is a normal write command or a Read Modify Write command upon application of the write command are provided. According to various exemplary embodiments of the inventive concept, time loss that may occur when implementing the ECC circuit having a data masking DM function on chip can be prevented. According to various exemplary embodiments of the inventive concept, a write operation is performed without a conventional lapse of pre-reading time conventionally required for data masking if the execution of the data masking is not commanded.

According to an aspect of the inventive concept, there is provided a memory device including: a memory cell array including a plurality of memory cells; a write command determination unit which determines whether a write command input to the memory device is (to be) accompanied by a masking signal and produces a first control signal if the input write command is/will be accompanied by a masking signal; a data modulation unit which combines a portion of read data read from the memory cell array with a portion of input write data corresponding to the write command and generates modulation data in response to the first control signal; and an error correction code (ECC) engine which generates parity of the modulation data.

The write command determination unit may determine whether an input command is a write command at all based on a signal applied to at least one first pin of the memory device and determines whether the write command is (to be) accompanied by a masking signal (e.g., whether the write command is a Read Modify Right command) based on a signal applied to a second pin thereof, (e.g., prior to actual receipt of a masking signal).

According to an aspect of the inventive concept, there is provided a memory system including a memory device and a memory controller for applying a write command to the memory device. The memory device includes: a memory cell array including a plurality of memory cells; a write command determination unit which determines whether a write command applied to the memory device is/will be accompanied a masking signal and produces a first control signal if the input write command is/will be accompanied by a masking signal; a data modulation unit which combines a portion of read data read from the memory cell array with a portion of input write data corresponding to the write command and generates modulation data in response to the first control signal; and an ECC engine which generates parity of the modulation data.

According to an aspect of the inventive concept, there is provided a memory device including: a wide input/output (I/O) interface for receiving write data and a write command; a write command determination unit which determines whether the write command is a Read Modify Write (RMW) command based on a signal applied to a command/address (CA) pin in the wide I/O interface; a data modulation unit which, if the write command is an RMW command, generates modulation data by masking a first portion of the write data and substituting a first portion of read data read from a memory cell array; an ECC engine which generates parity of the modulation data; and a writing unit which writes the modulation unit and the parity to the memory cell array.

According to an aspect of the inventive concept, there is provided a mobile apparatus having a memory device which includes: a memory cell array including a plurality of memory cells; a write command determination unit which determines whether an input write command is (to be) accompanied by a masking signal and produces a first control signal if the input write command is accompanied by a masking signal; a data modulation unit which generates modulation data in response to the first control signal by combining a portion of read data read from the memory cell array with a portion of input write data corresponding to the write command; and an ECC engine which generates parity of the modulation data.

According to an aspect of the inventive concept, there is provided a method of writing data in a memory device including an ECC engine, which includes: receiving a write command and first data to be written to a memory cell array of the memory device in response to the write command; determining whether a data masking signal which dictates masking of a portion of the first data shall accompany the write command; reading second data stored in a region of the memory cell array corresponding to the address specified in the write command if the write command shall be accompanied by a data masking signal; generating third data by using the first data and the second data according to the data masking signal; and encoding an ECC parity value of the third data by using the ECC engine.

According to an aspect of the inventive concept, there is provided a method of writing data in a memory device including an ECC engine, which includes: receiving a write command and first data to be written to a memory cell array of the memory device in response to the write command; receiving a data masking signal; generating third data corresponding to the data masking signal by combining the first data with second data stored in a region of the memory cell array corresponding to the address specified in the write command; and writing the third data to the region of the memory cell array corresponding to the address specified in the write command, wherein a column select signal for reading the second data from the memory cell array is activated before reception of the data masking signal.

The exemplary embodiments of the inventive concept will now be described more fully hereinafter with reference to the accompanying drawings. These embodiments are provided so that this disclosure will be thorough and complete and will fully convey the exemplary embodiments to those of ordinary skill in the art. The exemplary embodiments may, however, be embodied in many different forms and should not be construed as limited to the embodiments set forth herein. It should be understood that the exemplary embodiments described therein should be not considered for purposes of limitation, and the present invention should be construed as including all the changes, equivalents, and substitutions included in the spirit and scope thereof. Like numerals denote like elements throughout. In the drawings, the dimensions of structures are exaggerated or reduced for clarity as compared to their actual sizes.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

BRIEF DESCRIPTION OF THE DRAWINGS

Exemplary embodiments of the inventive concept will be more clearly understood from the following detailed description taken in conjunction with the accompanying drawings in which:

FIG. 4 is a table illustrating an example in which the write command shown in FIG. 1 is a Read Modify Write (RMW) command;

FIG. 9 is a table illustrating an example in which the write command shown in FIG. 1 is a normal write command;

FIG. 13 is a table illustrating an example in which the write command is the RMW command shown in FIG. 12;

DETAILED DESCRIPTION OF THE EXEMPLARY EMBODIMENTS

Figure 1A:
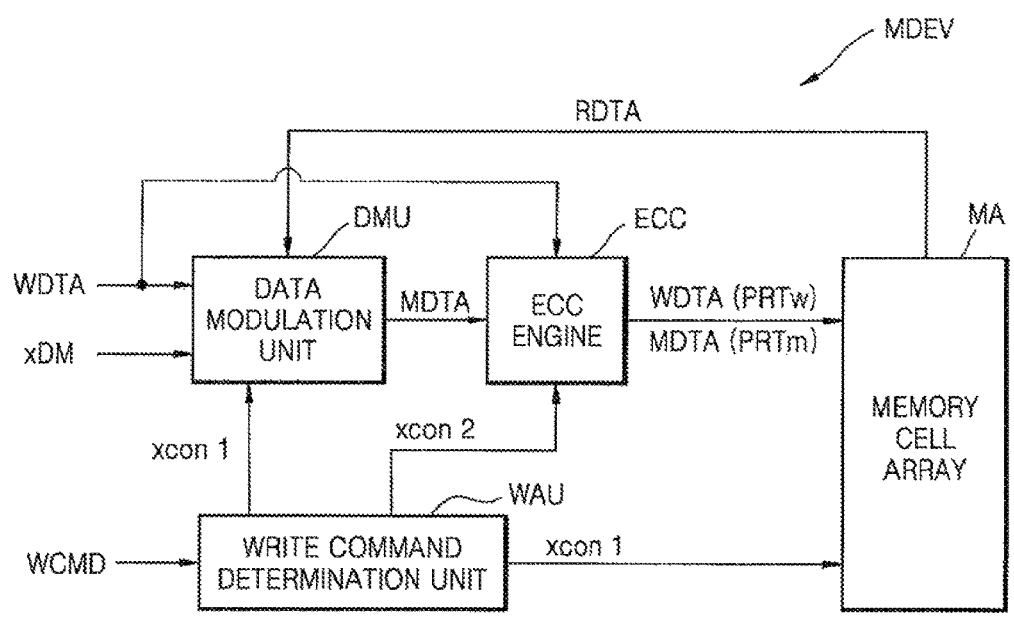
FIG. 1A is a block diagram of a memory device according to an exemplary embodiment of the inventive concept.
Figure 1B:
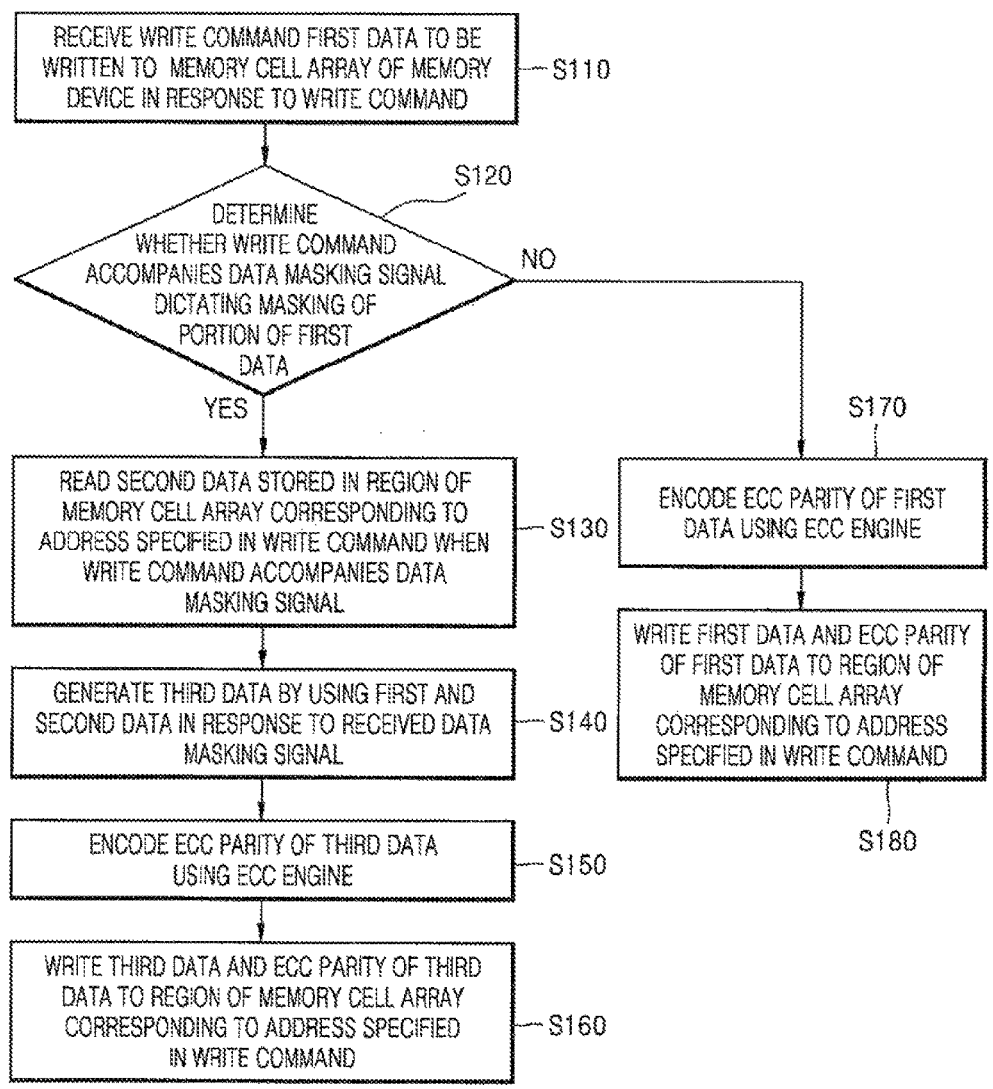
FIG. 1B is a flowchart of a method of writing data in the memory device of FIG. 1A.

FIG. 1A is a block diagram of a memory device MDEV according to an exemplary embodiment of the inventive concept, and FIG. 1B is a flowchart of a method of writing data in the memory device MDEV of FIG. 1A according to an exemplary embodiment of the inventive concept. Referring to FIGS. 1A and 1B, the memory device MDEV includes a memory cell array MA, a write command determination unit WAU, a data modulation unit DMU, and an ECC engine ECC.

The memory device MDEV is preferably a Dynamic Random Access Memory (DRAM) device. The memory cell array MA includes a plurality of memory cells (not shown), each having a memory cell capacitor (not shown). The value of each data bit stored is indicated by the amount of an electric charge stored in the corresponding memory cell capacitor. To maintain the charge stored in the cell capacitor, the memory device MDEV performs a periodic refresh operation or a refresh operation automatically in response to receiving any command.

When a write command WCMD for writing write data WDTA is supplied to the memory device MDEV (S110), electric charges corresponding to the write data WDTA are applied to the cell capacitors in the region of the memory cell array specified by an address accompanying the write command WCMD. A memory controller MCtrl shown in FIG. 2 transmits the write command WCMD and the like.

For convenience of explanation, FIGS. 1A and 1B are commonly referred to as FIG. 1.

Figure 2:
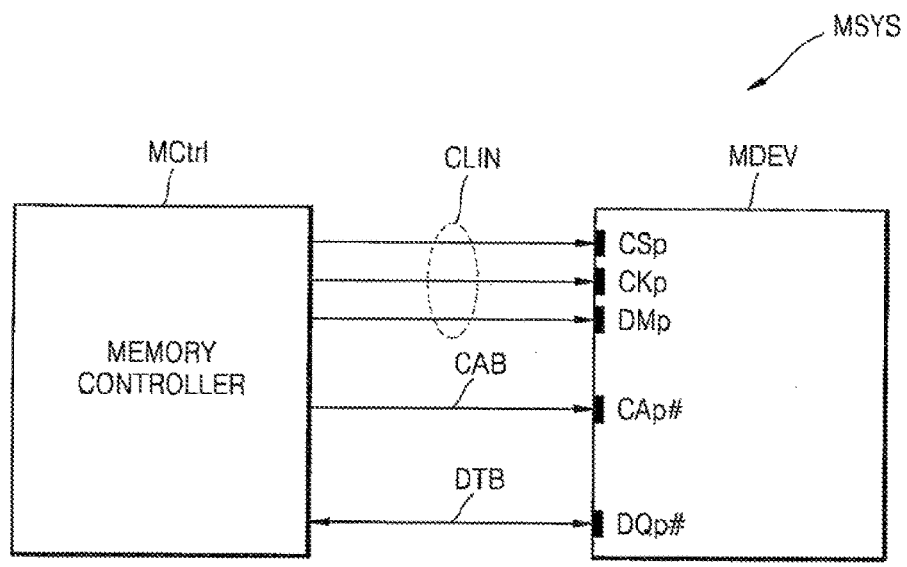
FIG. 2 is a block diagram of a memory system including the memory MDEV device of FIG. 1A according to an exemplary embodiment of the inventive concept.

FIG. 2 illustrates a memory system including the memory device MDEV of FIG. 1 according to an exemplary embodiment of the inventive concept. Referring to FIGS. 1 and 2, the memory system MSYS according to the exemplary embodiment includes the memory controller MCtrl and the memory device MDEV.

The memory controller MCtrl provides various control signals to the memory device MDEV and controls the operation of the memory device MDEV. For example, the memory controller MCtrl supplies the write command WCMD and other commands to the memory device MDEV. The commands that the memory controller MCtrl sends to the memory device MDEV include the write command WCMD, a read command for reading read data RDTA from the memory cell array MA, and a refresh command for refreshing a memory cell when the memory device MDEV includes DRAM cells. The memory controller MCtrl also sends addresses with the commands to the memory device MDEV to thereby access memory cell array MA.

For low power, high speed operation, the memory device MDEV or the memory system MSYS according to the exemplary embodiment may further include a common command/address bus CAB and a common command/address pin CAp# for providing commands and addresses to the memory device MDEV from the memory controller MCtrl. For example, the memory device MDEV or the memory system MSYS according to the exemplary embodiment may be implemented as a Low Power Double Data Rate (LPDDR) DRAM device or LPDDR DRAM system. The command/address bus CAB and the command/address pin CAp# are hereinafter referred to as a CA bus and a CA pin, respectively.

Figure 3:
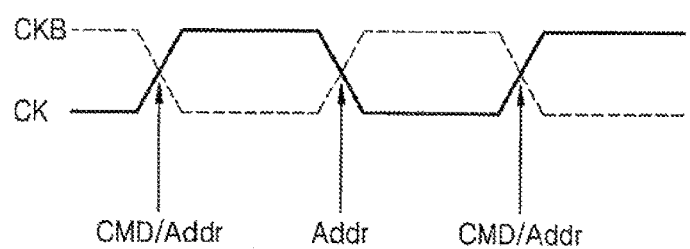
FIG. 3 is a graph illustrating the timing relationship between clock signal, command, and address signals that are applied to the memory device of FIG. 1A.

Referring to FIG. 3, the memory controller MCtrl transfers commands/addresses CMD/Addr and addresses Addr on rising and falling edges of a clock signal CK, respectively. For example, the address Addr being transmitted with the command CMD on the rising edge of the clock signal CK may include an upper address such as a bank address. The clock signal CK and an inverted clock signal CKB may be generated together as continuous alternating inverted signals. Thus, when the CA bus CAB consists of n-bit command/address bus, where n is a natural number, 2n-bit command/address signals CA may be provided to the memory device MDEV.

Referring to FIGS. 1 and 2, the memory controller MCtrl can transmit various control signals for controlling the memory device MDEV in addition to commands. For example, the memory controller MCtrl may send a chip select signal, a clock signal, and a masking signal xDM to command pins CSp, CKp, and DMp of the memory device MDEV through corresponding ones of control signal lines CLIN.

Write data WDTA and read data RDTA can be transferred over a DQ bus DTB connecting between the memory controller MCtrl and the memory device MDEV. For example, when the unit of data transfer from and to the memory device MDEV is ×32 (DQ[31:0]), the number of DQ pins DQp# may be 32. Alternatively, when the unit of data transfer from and to the memory device MDEV is ×16(DQ[15:0]), the number of DQ pins DQp# may be 16.

Referring back to FIG. 1, the write command determination unit WAU determines whether a write command WCMD input into the memory device MDEV is the first write command accompanying a masking signal xDM and produces a first control signal xcon1 (S120 in FIG. 1B) according to that determination. Masking is the process of restricting processing of data in a predetermined bit-range. Once a signal for controlling a masking operation is enabled for designated bits, data is not written for those bits even if a write command for writing the data is enabled. As a result of masking, the bits of already (e.g., previously) stored data in the predetermined bit-range indicated by masking signal xDM are not disturbed nor changed by the current write command accompanying a masking signal xDM. The masking signal xDM dictates masking of a portion of write data WDTA as described above and can be transmitted from the memory controller MCtrl.

The first write command accompanying a masking signal xDM may be denoted as a Read Modify Write (RMW) command, in the sense that the bits of already (e.g., previously) stored data outside of the predetermined bit-range indicated by masking signal xDM are modified by the current data. The masking signal xDM can be applied to the memory device MDEV at a different point in time than the first write command. For example, the masking signal xDM may be synchronized to receipt of a portion of the write data WDTA to be masked and applied to the memory device MDEV. The masking signal may be input to the memory device in synchronization with transmission of a portion of the write data to be masked in the memory device. The masking signal xDM will be described in more detail below. An example in which the write command shown in FIG. 1 is a RMW command in step S120 is now described in more detail.

Figure 5:
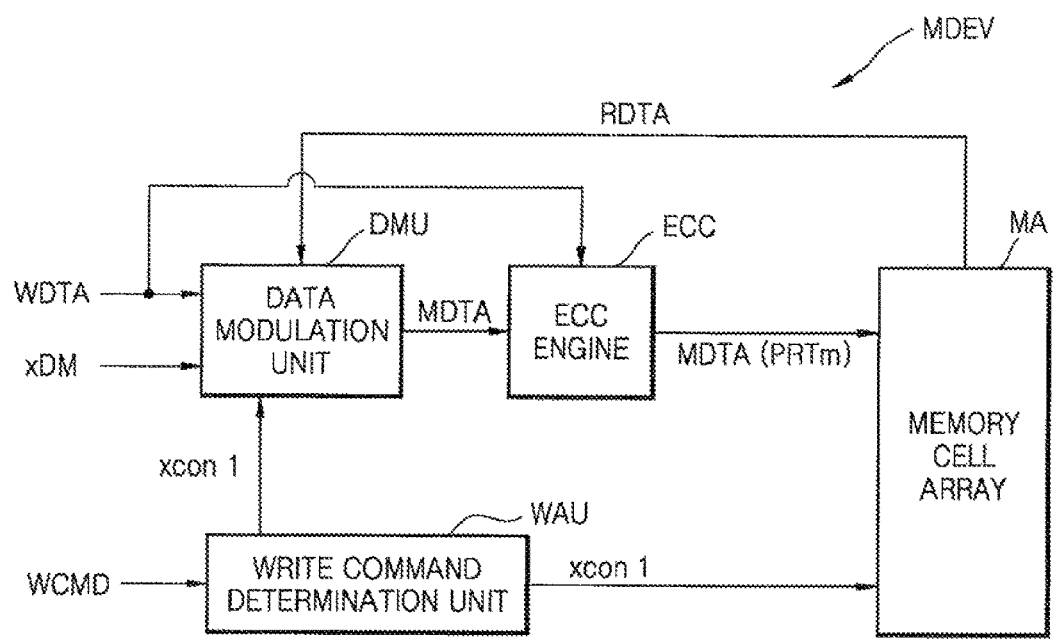
FIG. 5 is a block diagram labeled to illustrate the operation of the memory device of FIG. 1A when the write command is a RMW command.

FIG. 4 is a table illustrating an example in which the write command shown in FIG. 1 is a RMW command, and FIG. 5 illustrates an operation of the memory device MDEV of FIG. 1 when the write command is a RMW command. Referring to FIGS. 1, 4 and 5, when logic levels of a clock signal CK and an inverted chip select signal /CS applied to command pins of the memory device MDEV according to the exemplary embodiment are logic high H and logic low L, respectively, and a command is input into the memory device MDEV, the write command determination unit WAU determines that the command is a write command WCMD based on a signal applied to at least one first pin of the memory device MDEV shown in FIG. 2. The write command determination unit WAU then determines that the write command WCMD is a RMW command based on a signal applied to a second pin of the memory device MDEV shown in FIG. 2.

For example, the at least one first pin may be at least one CA pin CAp#, and the second pin may be one of the remaining CA pins CAp#. The at least one first pin may be first through third CA pins CA0 CA1 and CA2 for receiving a row address strobe signal, a write enable signal, and a column address strobe signal, respectively, and the second pin may be a fourth CA pin CA3. As described above, the command may be applied to the memory device MDEV during a rising edge of the clock signal CK.

When logic levels of signals applied to the first through third CA pins CA0, CA1, and CA2 at the rising edge of the clock signal CK are logic high H, logic low L, and logic low L, respectively, as shown in FIG. 4, the write command determination unit WAU determines that a write command WCMD is applied from the memory controller MCtrl shown in FIG. 2. Also a logic level of a signal that is applied to the fourth CA pin CA3. For example, if the signal applied to the fourth CA pin CA3 is at a logic low L level under the above conditions, the write command determination unit WAU determines that the write command WCMD is a RMW command requesting masking of a portion of write data WDTA and generates a first control signal xcon1 (shown in FIG. 1A and FIG. 5).

FIG. 5 is a block diagram illustrating the operation of the memory device of FIG. 1A when the write command is a RMW command. The first control signal xcon1 is applied to the memory cell array MA and to the data modulation unit DMU. Although FIG. 1A and FIG. 5 shows that the first control signal xcon1 is applied directly to the memory cell array MA, the first control signal xcon1 may be transported to a function block for reading data, such as a control logic (not shown) and a column decoder (not shown), so as to control reading of read data RDTA from the memory cell array MA (S130). A column select signal for reading read data RDTA from the memory cell array MA may be activated in response to the first control signal xcon1.

The read data RDTA may be data previously written to the address corresponding to the write command WCMD. For example, if the write command WCMD indicates that write data WDTA is to be currently written to a first location of the memory cell array MA, the read data RDTA may have been previously written to the same first location. In this case, the column select signal is used to select the columns (bit lines) coupled to the first location. The read data RDTA can be sensed from the columns (bit lines) of the memory cell array MA that are selected in response to the column select signal.

Figure 6:
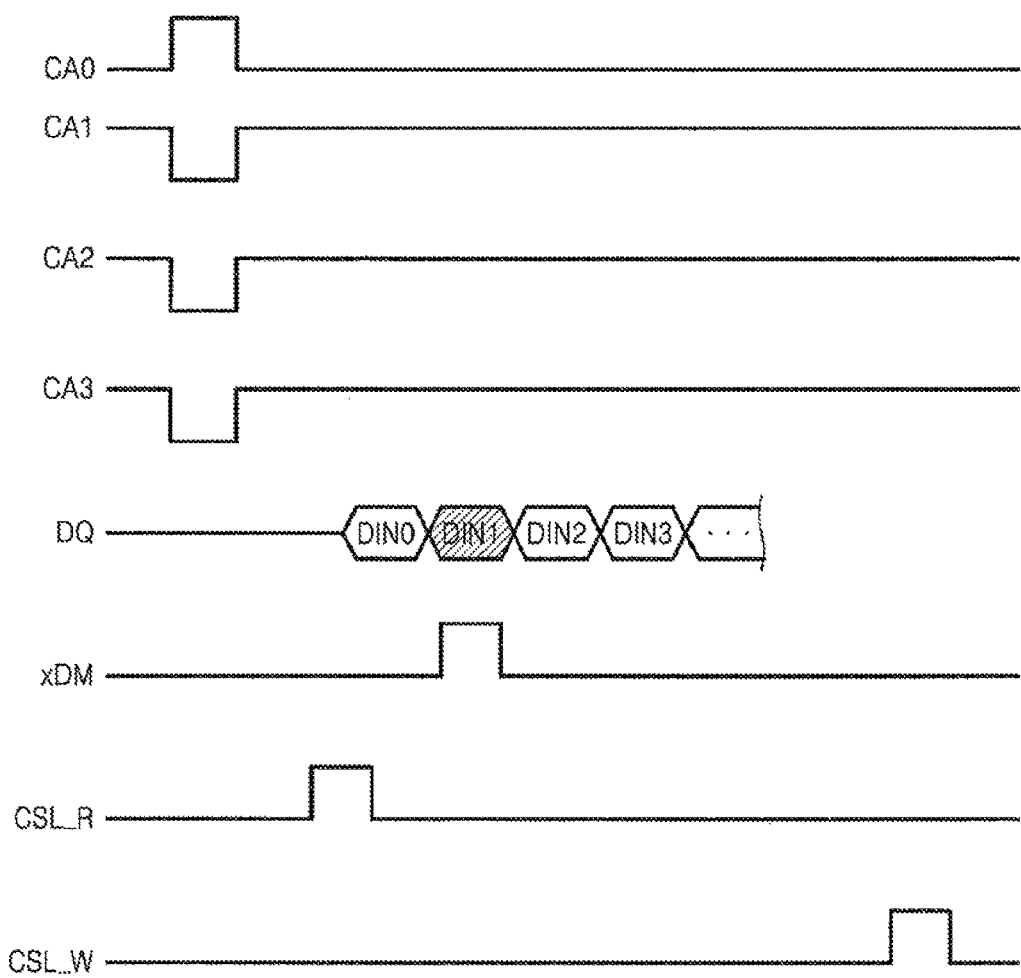
FIG. 6 is a timing diagram for a RMW command in the operation illustrated in FIG. 5.

FIG. 6 is a timing diagram for a RMW command in the operation illustrated in FIG. 5. Referring to FIG. 6, while signals applied to the first through third CA pins CA0 through CA2 are at logic high H level, logic low L level, and logic low L level, respectively, and while a signal applied to the fourth CA pin CA3 is at a logic low L level, the write command determination unit WAU determines that the write command WCMD is a RMW command that requests masking of a portion of write data WDTA and generates the first control signal xcon1. A column select signal CSL_R for reading data is then activated in response to the first control signal xcon1 regardless of activation of a masking signal xDM.

When the write command WCMD is a RMW command, the memory device MDEV according to the exemplary embodiment activates a column select signal CSL_R for reading read data RDTA regardless of activation of a masking signal xDM, thereby reducing the time taken to execute a RMW command, e.g., to read out read data RDTA.

Figure 7:
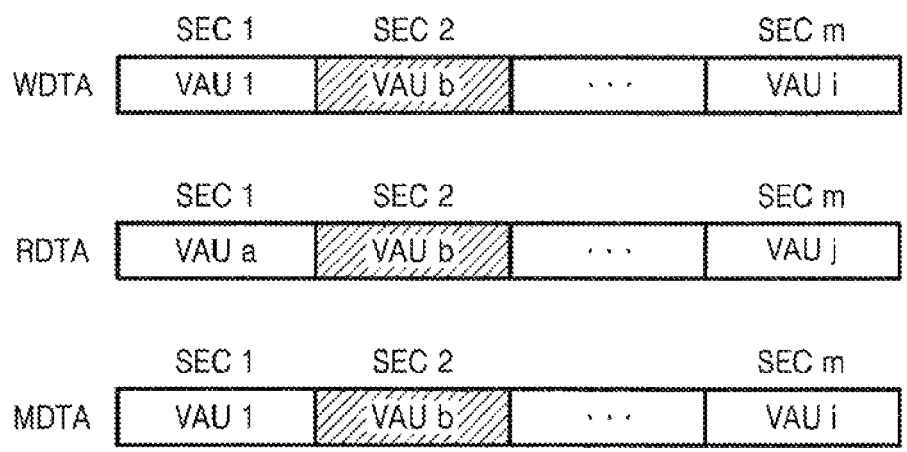
FIG. 7 is a diagram illustrating an example of a data masking operation according to a RMW command.

When the above operation is performed to read out read data RDTA, the data modulation unit DMU generates modulation data in response to the first control signal xcon1 (S140). FIG. 7 is a diagram illustrating an example of a data masking operation according to the RMW command illustrated in FIG. 5. Referring to FIGS. 5 and 6, the data modulation unit DMU combines a section of the read data RDTA read from the memory cell array with a section of the write data WDTA to generate modulation data MDTA. For example, when the masking signal xDM dictates masking of all of a second section SEC2 of the write data WDTA, the data modulation unit DMU combines the second section SEC2 of the read data RDTA as the second section SEC2 of the write data WDTA to generate modulation data MDTA. A portion of read data RDTA in a section (e.g., SEC 2 containing data value VAUb) and a portion of write data WDTA correspond to the other sections (e.g., other than SEC 2) shown in FIG. 7, respectively are combined to generate modulation data MDTA (e.g., containing data value VAUb in its SEC 2). The section size (bit-size) may be the smallest encoding unit (error correction unit) of the ECC engine ECC.

As shown in FIG. 6, the masking signal xDM is synchronized to a section (e.g., section DIN1) of input write data WDTA to be masked and then applied to the memory device MDEV or the data modulation unit DMU. When the masking signal xDM is applied to the memory device MDEV upon receiving data DIN1 so as to instruct masking of the data DIN1, the masking signal xDM may be at a logic high H level. The masking signal xDM may be applied to one pin DMp of the command pins shown in FIG. 2.

The data modulation unit DMU may need to hold information about the masking signal xDM until the read data RDTA is read after applying the masking signal to the pin DMp. For example, the read data RDTA may be transmitted to the data modulation unit DMU after a lapse of a predetermined number of clocks from the activation of the column select signal CSL_R for reading as shown in FIG. 6. Specifically, the read data RDTA may be sent to the data modulation unit DMU after the lapse of the time taken for a sense amplifier to sense data of a memory cell connected to a selected column (bit line) and the time taken to transmit read data via a signal line. Thus, the data modulation unit DMU may be configured as shown in FIG. 8 to maintain (or buffer) information about the masking signal xDM until receiving the corresponding read data RDTA.

Figure 8:
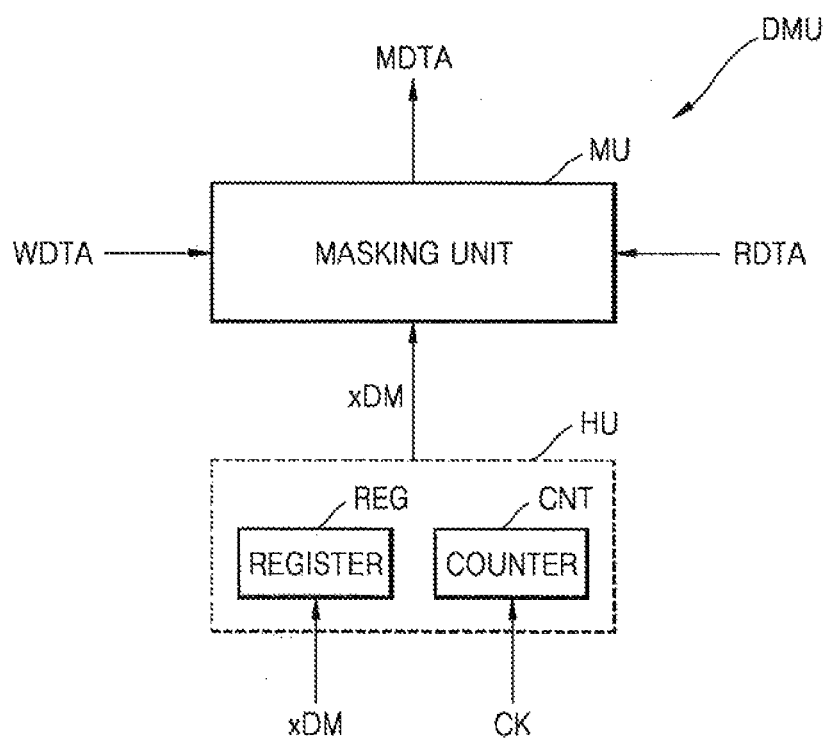
FIG. 8 is a block diagram labeled to illustrate an exemplary implementation of the data modulation unit shown in FIG. 5.

FIG. 8 illustrates an exemplary implementation of the data modulation unit DMU shown in FIG. 5. Referring to FIGS. 5 and 8, the data modulation unit DMU includes a holding unit HU and a data masking unit MU. The holding unit HU receives a masking signal xDM and holds it until the data modulation unit DMU receives read data RDTA. To accomplish this, the holding unit HU includes a register REG for storing the input masking signal xDM and a counter CNT for counting the number of clock signals CK that are applied to the data modulation unit DMU. For example, assuming that the read data RDTA will be transmitted to the data modulation unit DMU upon the lapse of 8 clocks after the masking signal xDM is stored in the register REG, the stored read data RDTA is transmitted to the masking unit MU when the number of clock signals CK counted by the counter CNT reaches 8. The masking unit MU receives the masking signal xDM from the holding unit HU and combines a section of the read data RDTA with a section of the write data WDTA to thereby generate modulation data MDTA.

Referring to FIGS. 5 and 7, each of the write data WDTA, the read data RDTA, and the modulation data MDTA is divided into m sections where m is a positive integer. A section bit-size may be the same bit-size as the smallest encoding unit (error correction unit) of the ECC engine ECC. For example, as illustrated in FIG. 7, each of the write data WDTA, the read data RDTA, and the modulation data MDTA may be classified into error correction units, i.e., sections SEC1 through SECm.

The unit of error correction by the ECC engine ECC may be equal to the unit of masking. The unit of masking may refer to the smallest unit in which the data modulation unit DMU masks the write data WDTA. For example, when the memory device MDEV according to the exemplary embodiment operates in a burst mode for x number bits of data, x data may be input as write data WDTA in response to one write command WCMD. When the unit of data transfer from and to the memory device MDEV is ×32 (DQ[31:0]), each data carries 4 bytes (one byte=eight bits), and the write data WDTA has a size of 4x. Alternatively, when the unit of data transfer from and to the memory device MDEV is ×16(DQ [15:0]), each data carries 2 bytes, and the write data WDTA has a size of 2x. Each section, which is the smallest masking unit, may have a length of any number of bytes. For example, the section may have a length of 1 byte, 2 bytes, or 4 bytes or the same length as that of the write date WDTA. Alternatively, the masking unit may have a length of any number of bits. For example, the masking unit may have a length of 1 bit or 2 bits. The unit of error correction by the ECC engine ECC may be larger than the masking unit. Even if the error correction unit is different from the masking unit, the data masking operation illustrated in FIG. 7 may be performed for each error correction unit.

Referring to FIG. 1, the ECC engine ECC encodes modulation data MDTA to produce parity PRTm of the modulation data MDTA in response to the first control signal xcon1 (step S150 in FIG. 1B). The ECC engine ECC may perform various well-known functions related to error detection and correction. For example, the ECC engine ECC can perform ECC encoding to generate parity during a data write operation, or perform ECC decoding to correct error bits in read data during a data read operation. In one embodiment, the ECC engine ECC may include an ECC encoder (not shown) that generates parity data, an error detector (not shown) that detects the number of error bits in read data (or in a codeword containing data and its parity), and an error corrector (not shown) that corrects the error bits.

The ECC engine ECC may perform the above operations such as encoding, decoding, and correction using hamming codes. The ECC engine ECC may perform the encoding and decoding operations in any unit of data, and as described above, the unit of error correction by the ECC engine ECC may be equal to or larger than the unit of masking by the data modulation unit DMU. The ECC engine ECC performs an ECC operation on the modulation data MDTA where a portion of the write data WDTA required for masking has been modulated, thereby preventing occurrence of errors during ECC encoding and ECC decoding of the write data WDTA due to the required portion of the write data WDTA. For example, performing ECC encoding only on the masked portion of write data WDTA may result in an error in parity. Likewise, ECC decoding and error correction of only the masked portion of write data WDTA may suffer from an error in parity.

When parity PRTm of the modulation data MDTA is generated by the ECC engine ECC, the modulation data MDTA and its parity PRTm are then stored in the memory cell array MA (S160). In this case, as shown in FIG. 6, a column select signal CSL_W for selecting a column (bit line) indicated by an address corresponding to write command WCMD and performing a write operation is activated. For example, the modulation data MDTA may be written to a user data area (not shown) of the memory cell array MA while the parity PRTm of the modulation data MDTA may be written to a parity region (not shown) thereof. Once the modulation data MDTA is written to the memory cell array MA, the memory device MDEV can transmit a response to the write command WCMD to the memory controller MCtrl shown in FIG. 2 to notify the memory controller MCtrl of the execution of the write command WCMD.

Referring back to FIG. 1, when the write command WCMD input into the memory device MDEV is a second write command that does not accompany the masking signal xDM in step S120, the write command determination unit WAU generates a second control signal xcon2. The second write command may hereinafter be called a 'normal write command'.

Figure 10:
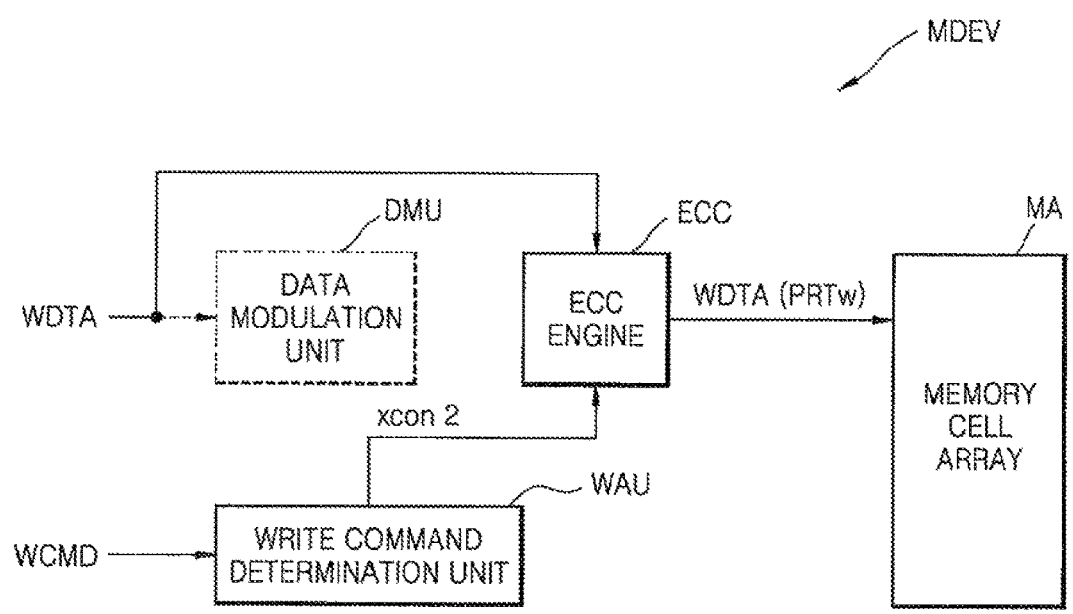
FIG. 10 is a block diagram illustrating the operation of the memory device of FIG. 1A when the write command is a normal write command.

FIG. 9 is a table showing an example in which the write command shown in FIG. 1 is a normal write command. FIG. 10 is a block diagram labeled to illustrate the operation of the memory device MDEV of FIG. 1A when the write command is a normal write command. Referring to FIGS. 9 and 10, when logic levels of a clock signal CK and an inverted chip select signal /CS applied to command pins of the memory device MDEV according to the exemplary embodiment are logic high H and logic low L, respectively, and a command is input into the memory device MDEV, the write command determination unit WAU determines that the command is a write command WCMD based on a signal applied to at least one first pin of the memory device MDEV shown in FIG. 2. The write command determination unit WAU then determines that the write command WCMD is a normal write command based on a signal applied to a second pin of the memory device MDEV shown in FIG. 2.

For example, the at least one first pin may be at least one CA pin CAp#, and the second pin may be one of the remaining CA pins CAp#. The at least one first pin may be first through third CA pins CA0, CA1, CA2 for receiving a row address strobe signal, a write enable signal, and a column address strobe signal, respectively, and the second pin may be a fourth CA pin CA3. As described above, the command may be applied to the memory device MDEV at a rising edge of the clock signal CK.

For example, when logic levels of signals applied to the first through third CA pins CA0 through CA2 at the rising edge of the clock signal CK are logic high H, logic low L, and logic low L, respectively, as shown in FIG. 9, the write command determination unit WAU determines that a write command WCMD is applied from the memory controller MCtrl shown in FIG. 2 and then a logic level of a signal which is applied to the fourth CA pin CA3. For example, if the signal applied to the fourth CA pin CA3 is at a logic high H level under the above conditions, the write command determination unit WAU generates a second control signal xcon2 so that the write data WDTA is written to the memory cell array MA without being modulated.

The ECC engine ECC encodes write data WDTA to produce parity PRTw of the write data WDTA in response to the second control signal xcon2 (step S170 of FIG. 1B). Since the ECC engine performs the same operation as its operation on the modulation data MDTA described above, a redundant description thereof is not repeated. When the parity PRTw of the write data WDTA is generated by the ECC engine ECC, the write data WDTA and its parity PRTw are then stored in the memory cell array MA (step S180 of FIG. 1B)

Figure 11:
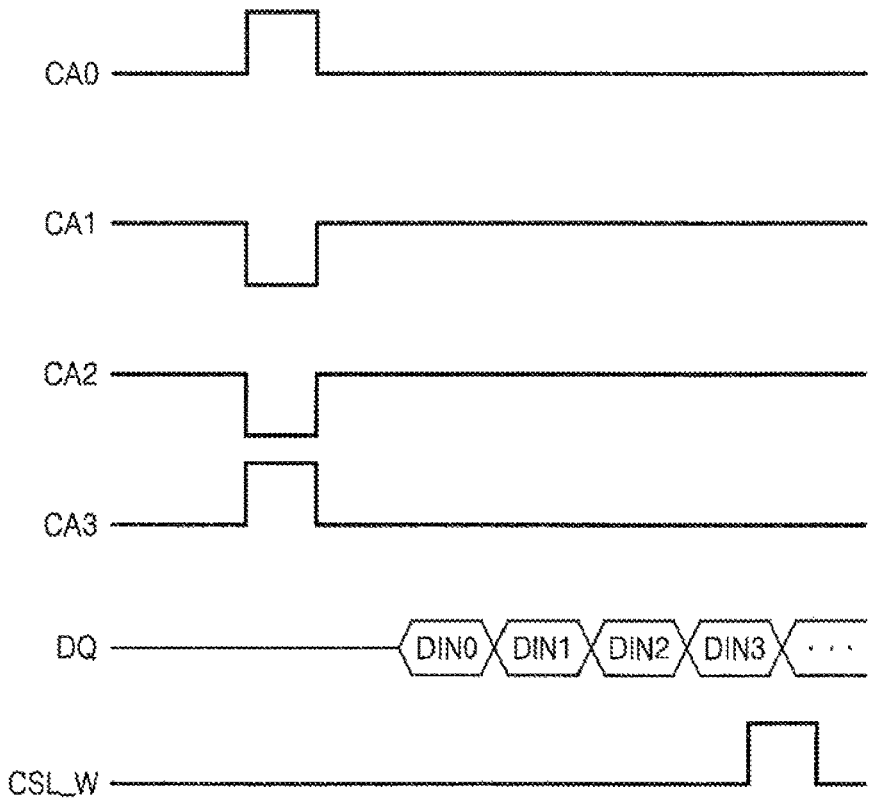
FIG. 11 is a timing diagram illustrating the normal write command in the memory device illustrated in FIG. 10.

FIG. 11 is a timing diagram for performing a normal write command in the memory device MDEV of FIGS. 1A and 10. Referring to FIG. 11, after a lapse of a predetermined time from the application of signals to the first through fourth CA pins CA0 through CA4, a column select signal CSL_W (for selecting a column (bit line) indicated by an address corresponding to write command WCMD and performing a write operation) is activated immediately without waiting for an activation of the masking signal xDM, For example, the write data WDTA may be written to a user data area (not shown) of the memory cell array MA while the parity PRTw of the write data WDTA may be written to a parity region (not shown) thereof. Once the write data WDTA is written to the memory cell array MA, the memory device MDEV can transmit a response to the write command WCMD to the memory controller MCtrl shown in FIG. 2 to notify the memory controller MCtrl of the execution of the write command WCMD.

As described above, if the write command WCMD is a normal write command, the memory device MDEV according to the exemplary embodiment performs a write operation without causing a separate delay for determining whether the masking signal xDM is activated. While the write command determination unit WAU has been described above as identifying a write command WCMD and a RMW command using CA pins, it may identify a write command WCMD by using CA pins and identify a RMW command by using additional command pins as described below.

Figure 12:
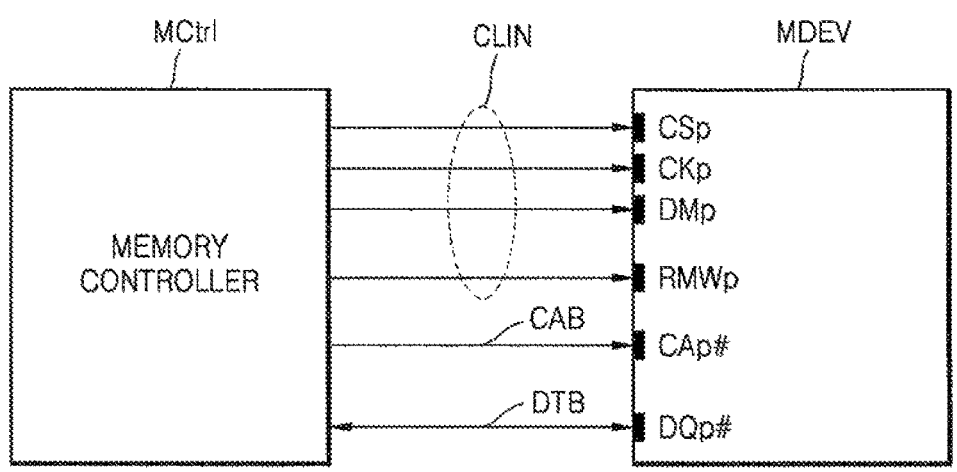
FIG. 12 is a block diagram illustrating another example in which the write command shown in FIG. 1 is set to a RMW command.

FIG. 12 is a block diagram of a memory system illustrating another example in which the write command WCMD shown in FIG. 1 is set to a RMW command; FIG. 13 is a table illustrating an example in which the write command WCMD is a RMW command shown in FIG. 12. Referring to FIGS. 1, 12, and 13, when logic levels of a clock signal CK and an inverted chip select signal /CS applied to command pins of the memory device MDEV according to the exemplary embodiment are logic high H and logic low L, respectively, and a command is input into the memory device MDEV, the write command determination unit WAU determines whether the command is a write command WCMD based on a signal applied to at least one first pin of the memory device MDEV shown in FIG. 12. The write command determination unit WAU then determines whether the write command WCMD is a RMW command based on a signal applied to a second pin of the memory device MDEV shown in FIG. 12.

For example, the at least one first pin may be at least one CA pin CAp#, and the second pin may not be any CA pins CAp# but may be a dedicated command pin RMWp deployed on the memory device MDEV, provided in addition to the command pins CSp CKp, and DMp of the memory device MDEV shown in FIG. 2. The at least one first pin may be first through third CA pins CA0, CA1, CA2 for receiving a row address strobe signal, a write enable signal, and a column address strobe signal, respectively.

Referring to FIG. 13, a signal applied to the dedicated command pin RMWp is at a logic high H level, and a command received from the memory controller is applied to the memory device MDEV at a rising edge of the clock signal CK. In the example shown in FIG. 13, a fourth CA pin CA3 may not be defined (RFU: Reserved Future Use) although it is set to logic high H and logic low L levels in the examples shown in FIGS. 4 and 9, respectively.

Figure 14:
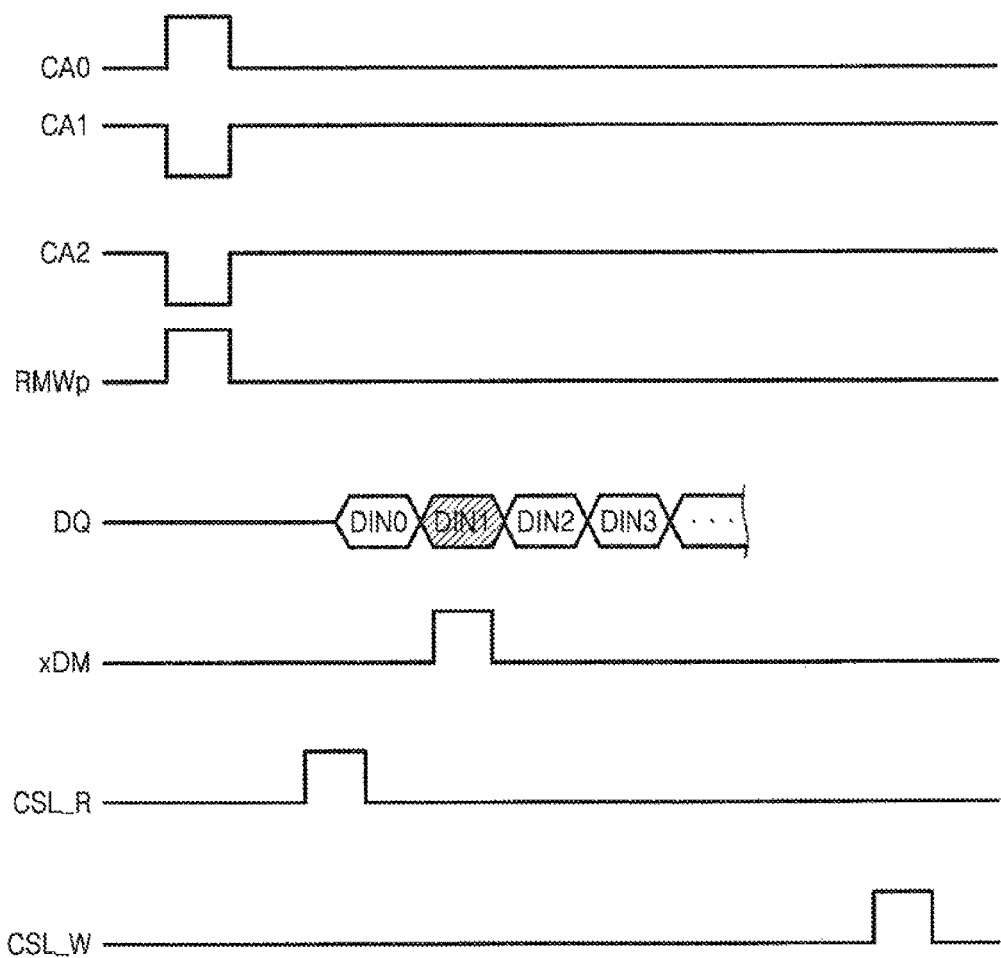
FIG. 14 is a timing diagram illustrating the operation of the memory device of FIG. 12 according to a RMW command.

FIG. 14 is a timing diagram illustrating the operation of the memory device MDEV shown in FIG. 12 according to a RMW command. Referring to FIGS. 1, 12, and 14, when logic levels of signals applied to the first through third CA pins CA0 through CA2 at the rising edge of the clock signal CK are logic high H, logic low L, and logic low L, respectively, the write command determination unit WAU shown in FIG. 1 determines that a write command WCMD is applied from the memory controller MCtrl; and a logic level of a RMW indication signal which is applied to the command pin RMWp is detected. For example, if the signal applied to the command pin RMWp is detected at a logic high H level under the above conditions, the write command determination unit WAU determines that the write command WCMD is a RMW command and generates a first control signal xcon1. A control select signal CSL_R for reading read data RDTA from the memory cell array MA is activated in response to the first control signal xcon1. Upon completion of an ECC operation on modulation data MDTA, a column select signal CSL_W for writing the modulation data MDTA to the memory cell array MA is activated.

Figure 15:
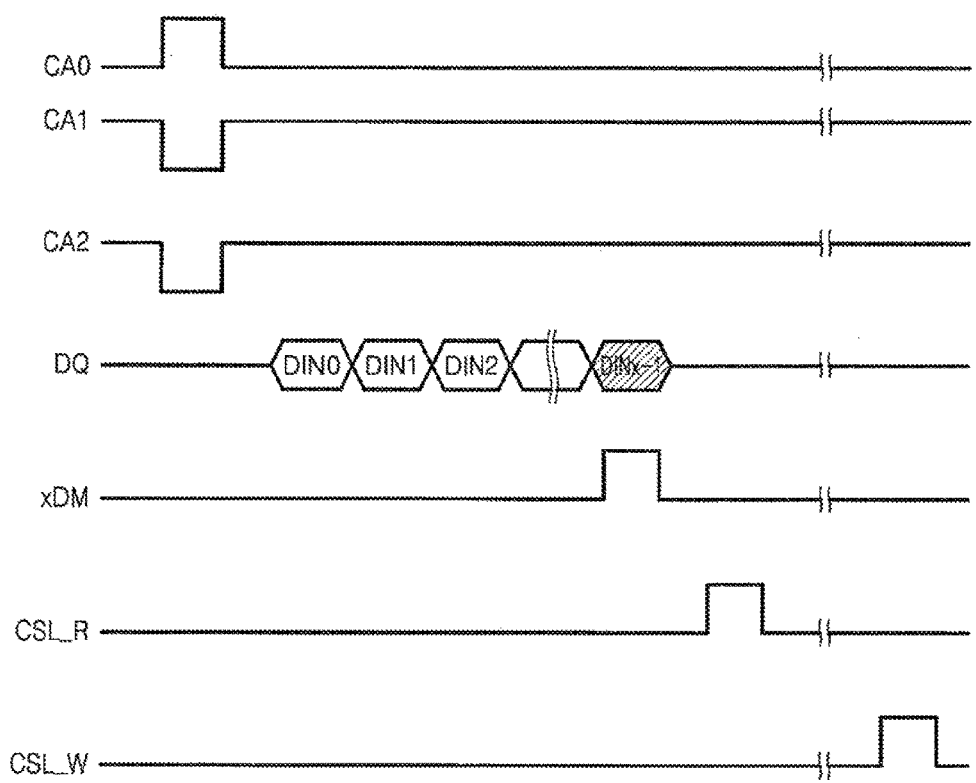
FIG. 15 is a timing diagram illustrating an operation in a memory device or memory system of the related art which is compared to a memory device or memory system according to an exemplary embodiment of the inventive concept.

FIG. 15 is a timing diagram illustrating an operation in a memory device or memory system of the related art which is to be compared to a memory device MDEV or memory system according to the exemplary embodiment. Referring to FIGS. 1 and 2, the memory device MDEV of FIG. 1 or memory system of FIG. 2 according to the exemplary embodiment determines whether the write command WCMD is a RMW command or a normal write command and performs operations optimized for the determination result. For example, as shown in FIG. 11, when a command applied to the memory device MDEV is the normal write command, the memory device MDEV activates a column select signal CSL_W for a write operation without waiting for activation of a masking signal xDM. When the normal write command is received, the column select signal CSL_W for a write operation is activated immediately after a required predetermined time is delayed. However, unlike in the memory device MDEV or memory system according to the exemplary embodiment, in the conventional memory device or memory system the operation of which is described with reference to FIG. 15, when a write command is applied under the conditions CA0=H & CA1=L & CA2=L (as shown in FIG. 13), the conventional memory device MDEV or memory system waits for a mask signal xDM regardless of whether the write command is a RMW command or a normal write command. This can unnecessarily delay the time point at which a column select signal CSL_R for reading read data RDTA from the memory cell array MA is activated, thereby increasing the conventional response time for a normal write command. In the conventional memory device MDEV or memory system, generation of the masking signal xDM is determined before executing the normal command, which is unnecessarily time consuming.

In particular, when the masking signal xDM is activated at a time point when the last data signal DINx−1 of the write data WDTA is input as shown in FIG. 15, a column select signal CSL_R for a read operation is then activated so that read data RDTA is applied to a data modulation unit DMU. After performing an ECC operation on modulation data MDTA, a column select signal CSL_W for a write operation is activated, and the write operations is performed. Thus, the write operation may be completed after a considerable lapse of time after application of the write command WCMD. To prevent this problem in a conventional memory device MDEV or memory system a column select signal CSL_R for a read operation may be activated unnecessarily upon application of the write command WCMD, which may unnecessarily increase power consumption.

Figure 16A:
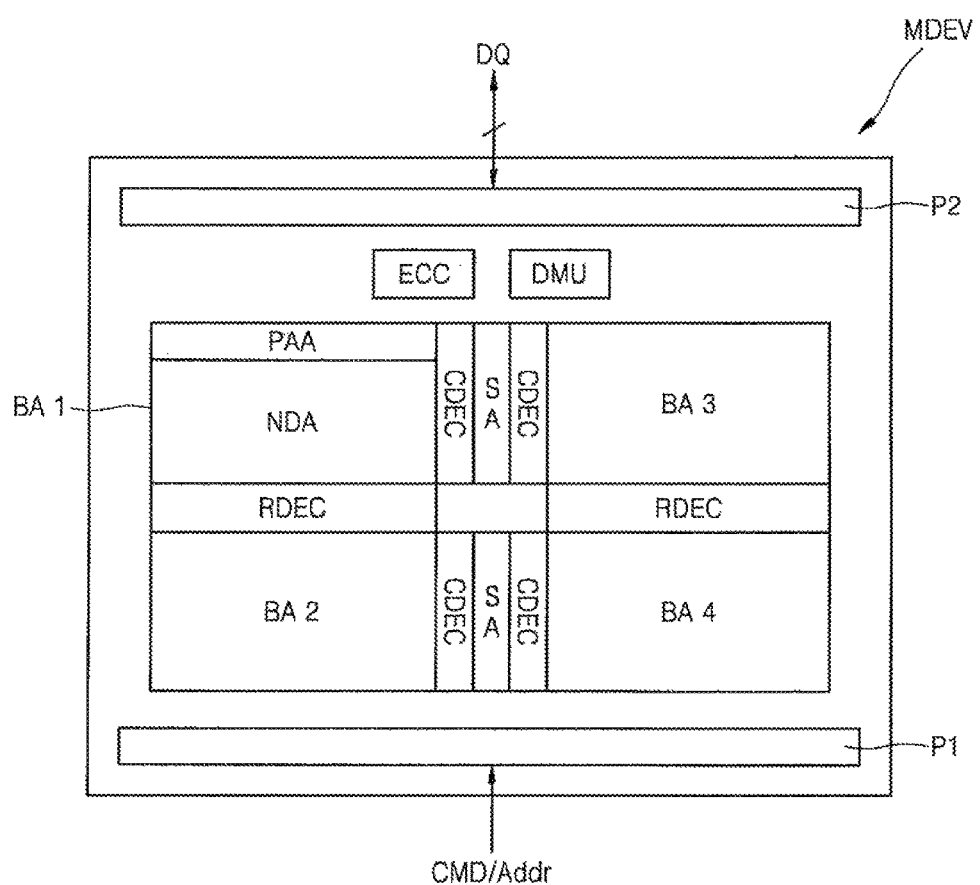
FIGS. 16A through 16C are block diagrams illustrating examples of implementations of a data modulation unit and an error correction code (ECC) engine in memory devices according to exemplary embodiments of the inventive concept.
Figure 16B:
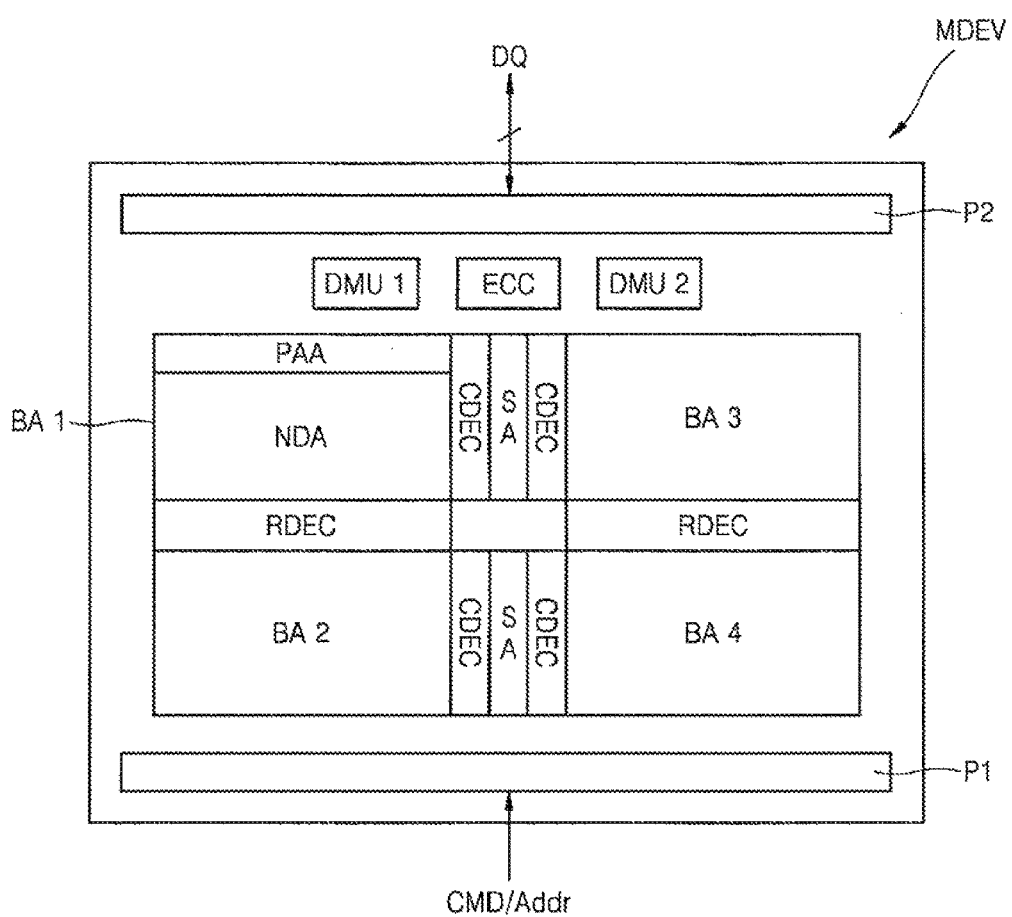
Figure 16C:
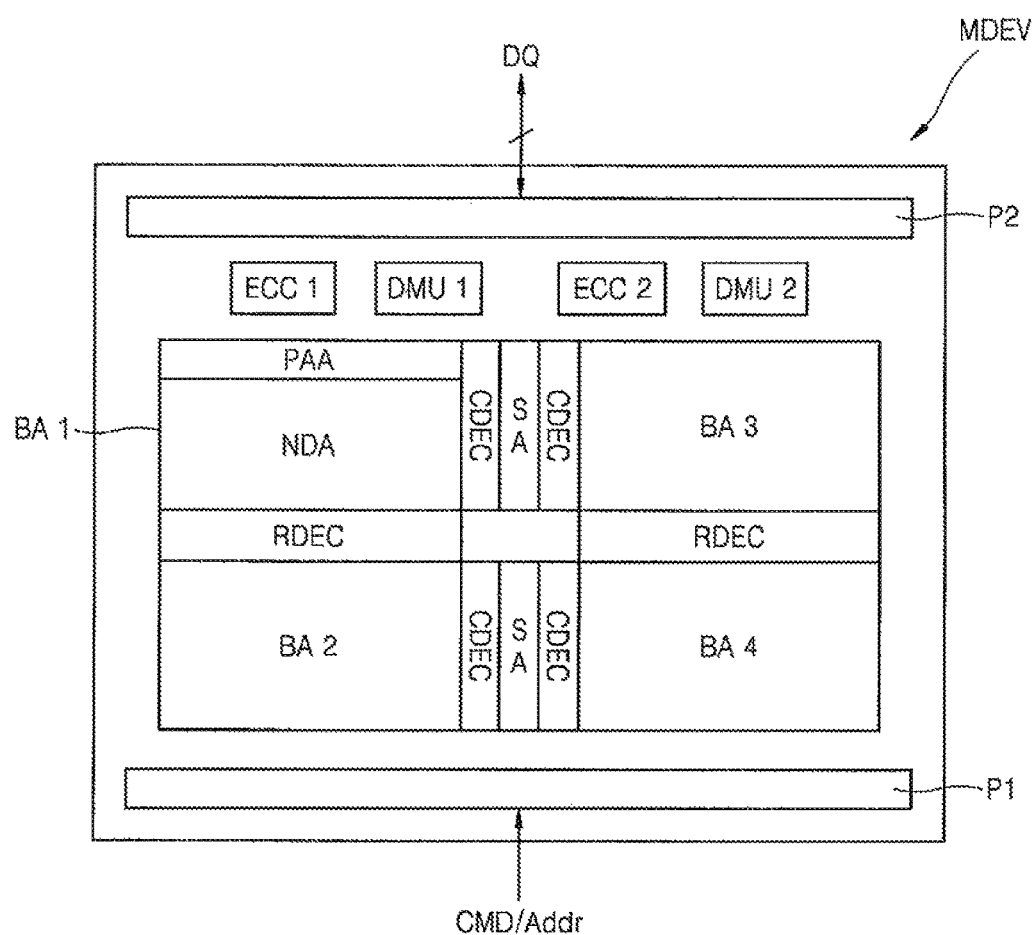

FIGS. 16A through 16C illustrate examples of implementations of a data modulation unit DMU and an ECC engine ECC in memory devices MDEVs according to exemplary embodiments of the inventive concept.

Referring to FIG. 1 and FIGS. 16A through 16C, each of the memory devices MDEVs according to the exemplary embodiments of the inventive concept includes pins P1 for receiving commands/addresses CMD/Addr at a first side and pins P2 for receiving data DQ at a second (e.g., opposite) side. While FIGS. 16A through 16C show that the memory cell array MA shown in FIG. 1 is divided into four banks BA1 through BA4 for purposes of illustration, the inventive concept is not limited thereto. Each of the four banks BA1 through BA4 may include a normal data area NDA for storing the write data WDTA or the modulation data MDTA and a parity area PDA for storing parities PRTw and PRTm. A row decoder RDEC, a column decoder CDEC, and a sense amplifier SA may be provided for each of the four banks BA1 through BA4. However, all or some of the row decoder RDEC, the column decoder CDEC, and the sense amplifier SA may be shared by at least two of the banks BA1 through BA4.

For example, the data modulation unit DMU according to the exemplary embodiment may be located between the pins P2 for receiving data DQ and the banks BA1 and BA3 adjacent to the pins P2. Furthermore, signal lines over which data to be read or written is transferred or bussed may be concentrated between the banks BA1 and BA3. The memory device MDEV is configured to have the data modulation unit DMU disposed at a region where bussing is concentrated, thereby reducing current dissipation or the time taken to transmit or receive read data RDTA, write data WDTA, and modulation data MDTA within the memory device MDEV. The ECC engine ECC according to the exemplary embodiment may also be disposed between the P2 and the banks BA1 through BA3, so that the time taken to transmit or receive the above data or power consumption may be reduced.

While FIG. 16A shows that the memory device MDEV includes one data modulation unit DMU and one ECC engine ECC, the inventive concept is not limited thereto. As shown in FIG. 16B or 16C, the memory device MDEV may include at least two data modulation units DMU or ECC engines ECCs provided for different banks BA1 through BA4. For example, in the memory device MDEV of FIG. 16B, a first data modulation unit DMU1 may determine the type of write commands for the banks BA1 and BA2 while a second data modulation unit DMU2 may determine the type of write commands for the banks BA3 and BA4. The ECC engine ECC may be shared by the first and second data modulation units DMU1 and DMU2 as shown in FIG. 16B or a separate ECC engine may be provided for each of them. According to the exemplary embodiments of the inventive concept, the data modulation unit DMU or the ECC engine ECC is provided for each or some of the banks BA1 through BA4, thereby allowing fast response to the write command. However, the inventive concept is not limited thereto.

Figure 17:
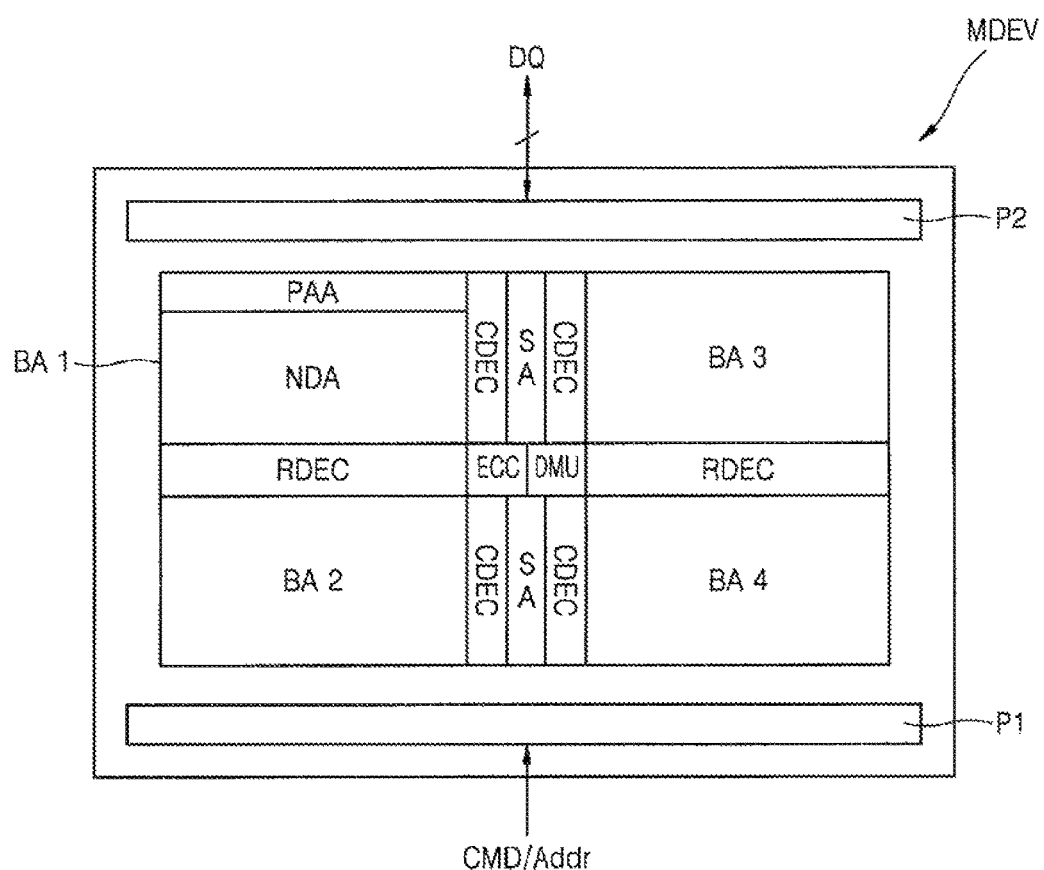
FIG. 17 is a block diagram illustrating another example of implementation of a data modulation unit and an ECC engine in a memory device according to an exemplary embodiment of the inventive concept.

FIG. 17 is a block diagram illustrating an example of an implementation of a data modulation unit DMU and an ECC engine ECC in a memory device MDEV according to an exemplary embodiment of the inventive concept. Referring to FIG. 17, the data modulation unit DMU and the ECC engine ECC are disposed at a peri region (i.e., peripheral to one or more memory cell regions) centrally positioned on the chip. The peri region may also have data signal lines or bussing concentrated thereon. While FIG. 17 illustrates the data modulation unit DMU and the ECC engine ECC are disposed between column decoders CDEC and a sense amplifier SA shared by the banks BA2 and B4 and column decoders CDEC and a sense amplifier SA shared by the banks BA1 and B3, the inventive concept is not limited thereto. The data modulation unit DMU and the ECC engine ECC may be disposed any other peri region where signal lines are concentrated according to the design requirements.

Figure 18A:
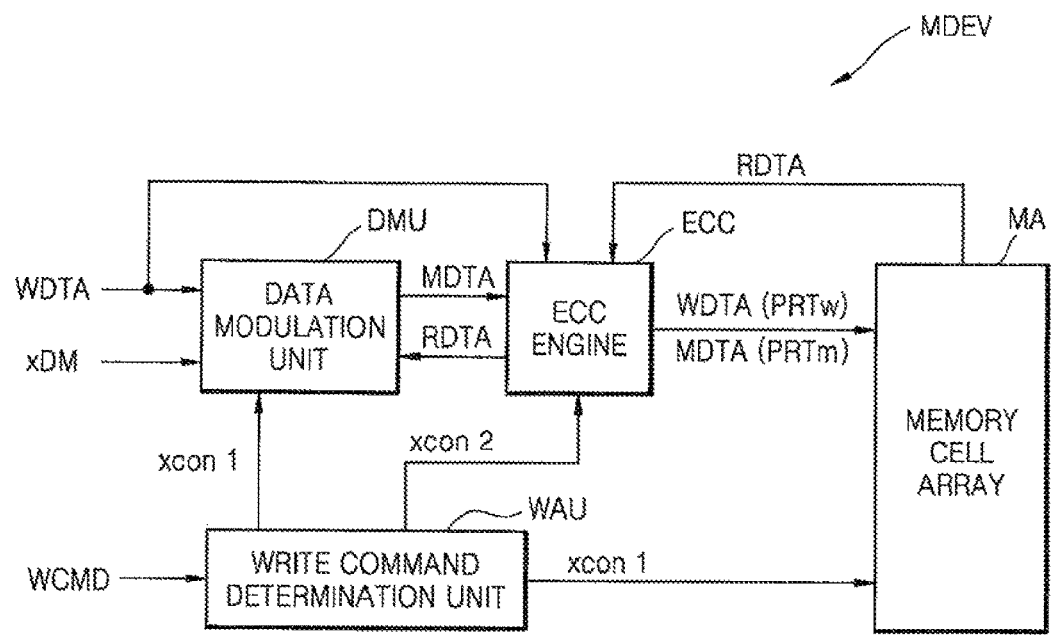
FIG. 18A is a block diagram of a memory device MDEV according to another exemplary embodiment of the inventive concept.
Figure 18B:
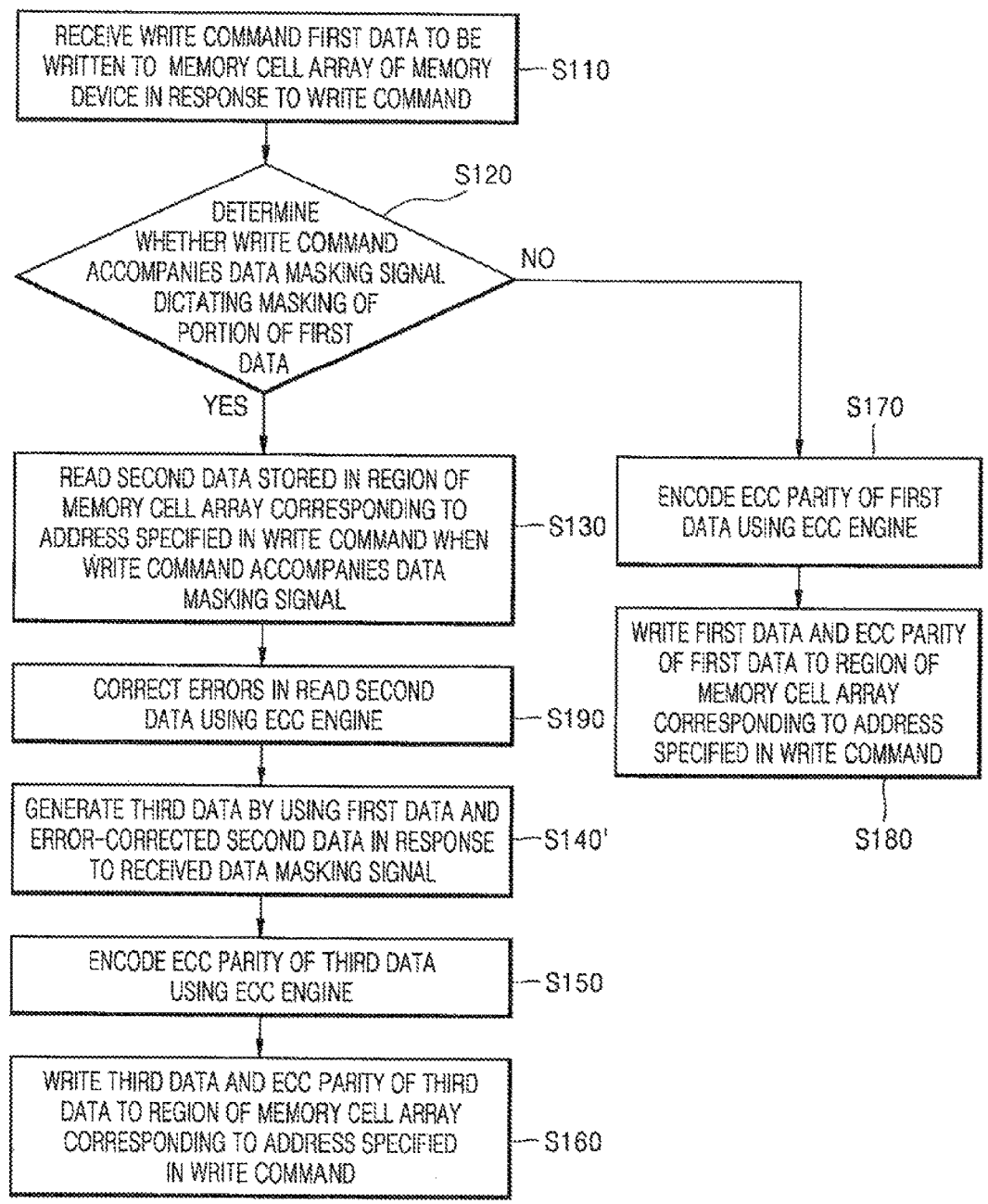
FIG. 18B is a flowchart of a method of writing data in the memory device MDEV of FIG. 18A.

FIG. 18A is a block diagram of a memory device MDEV according to an exemplary embodiment of the inventive concept, and FIG. 18B is a flowchart of a method of writing data in the memory device MDEV of FIG. 18A. Referring to FIGS. 18A and 18B, unlike the memory device MDEV of FIG. 1, the memory device MDEV according to this exemplary embodiment can perform additional ECC decoding and error correction on read data RDTA when write command WCMD is a RMW command and the read data RDTA is read (step S190 of FIG. 18B). For example, for a memory device or memory system requiring a higher level of reliability, error checking is performed on the read data RDTA before a write operation. A data modulation unit DMU modulates the read data RDTA and the write data WDTA is subjected to the error correction by the ECC engine ECC in the manner as described above and generates modulation data MDTA (step S140' of FIG. 18B). Other steps S110, S120, S130, S150, S160, S170 and S180 in the method of FIG. 18B are performed the same as these steps are performed in the method FIG. 1B.

Figure 19:
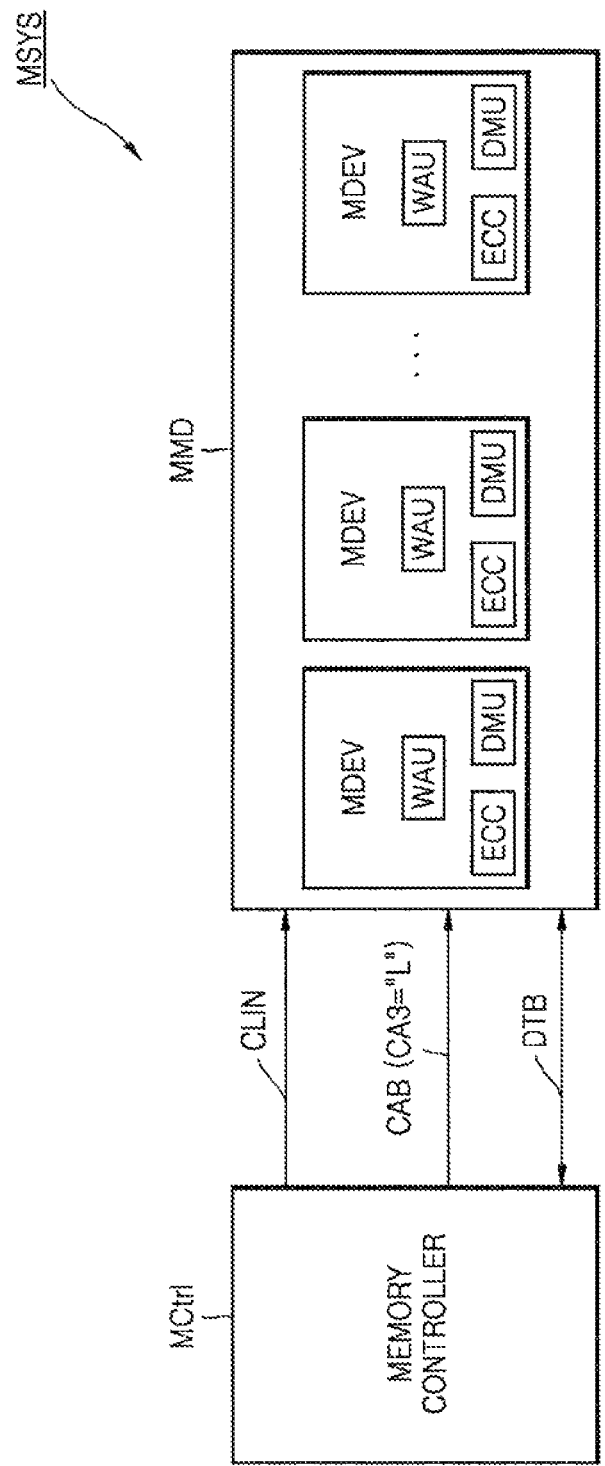
FIG. 19 is a block diagram of a memory system according to an exemplary embodiment of the inventive concept.

FIG. 19 is a block diagram of a memory system MSYS according to an exemplary embodiment of the inventive concept.

Referring to FIG. 19, the memory system MSYS includes a memory module MMD and a memory controller MCtrl. The memory module MMD includes at least one (e.g., a plurality of) memory device(s) MDEV mounted on a module board. For example, the memory device MDEV may be a DRAM chip. Each of the memory device(s) MDEV may have a configuration and operation according to one of the above exemplary embodiments of the inventive concept.

The memory controller MCtrl outputs various signals for controlling the memory devices MDEVs in the memory module MMD. For example, the memory controller MCtrl can output various command/address signals (CA signals) for operation of a memory and other control signals. The memory controller MCtrl can apply a CA signal for instructing a RMW command to a fourth CA pin of the memory device MDEV at a logic low L level. Alternatively, although not shown in FIG. 19, a RMW indication signal described above may be applied to a dedicated command pin of the memory device MDEV. Each of the memory devices MDEVs includes a write command determination unit WAU, a data modulation unit DMU, and an ECC engine ECC and is configured to determine whether an applied write command WCMD is a RMW command or a normal write command and to perform a write operation in a time or power optimized for the as-determined write command.

Figure 20:
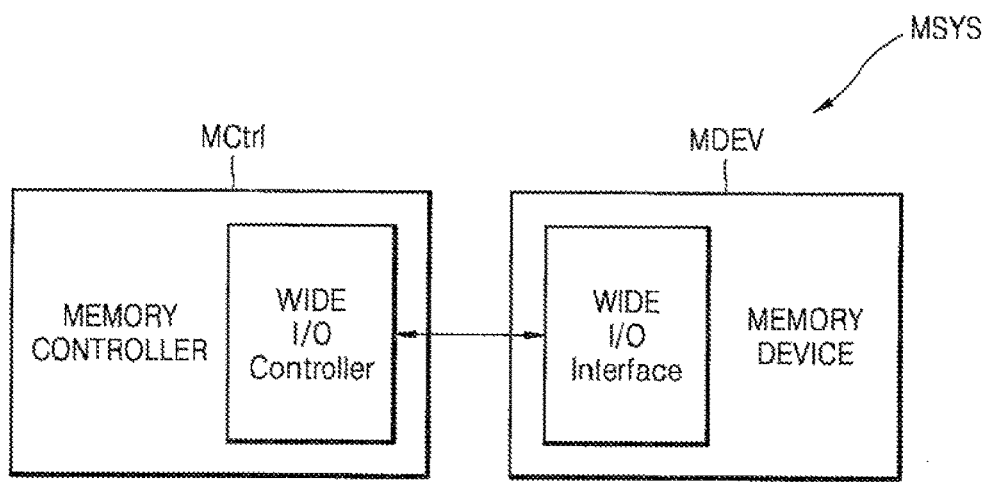
FIG. 20 is a block diagram of a memory system according to an exemplary embodiment of the inventive concept.

FIG. 20 is a block diagram of a memory system MSYS according to an exemplary embodiment of the inventive concept. Referring to FIG. 20, the memory system MSYS according to the exemplary embodiment includes a memory controller MCtrl and a memory device MDEV. The memory device MDEV includes a write command determination unit, a data modulation unit, and an ECC engine and is configured to determine whether an applied write command WCMD is a RMW command or a normal write command and to perform a write operation in a time or power optimized for the as-determined write command. For example, the memory device MDEV may be a LPDDR DRAM adopting a wide input/output (I/O) interface, and the memory controller MCtrl may include a wide I/O controller so as to communicate with the memory device MDEV via the wide I/O interface. In the memory system MSYS of FIG. 20, the wide I/O interface can support 4 128-bit channels and operate at 1.2 V power and transfer rate of 2133 Mtps.

Figure 21:
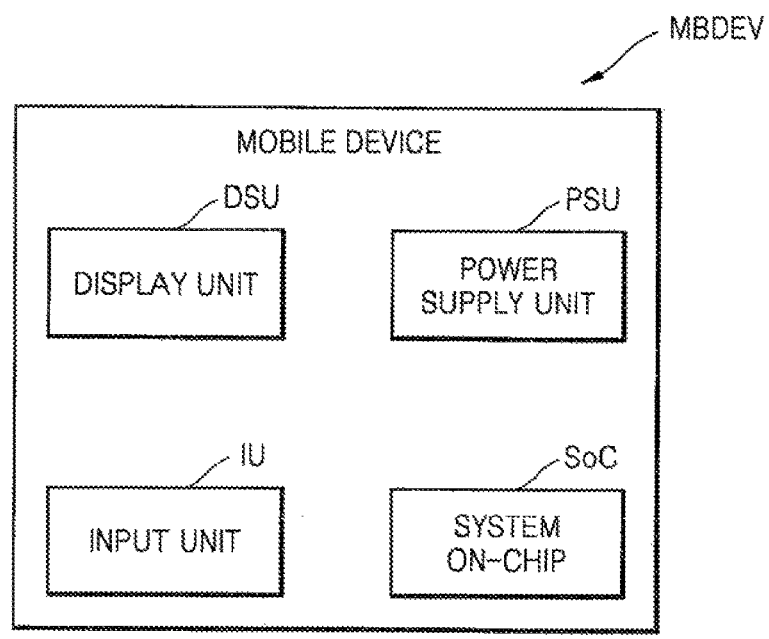
FIG. 21 is a block diagram of a mobile device including a memory device according to an exemplary embodiment of the inventive concept.

FIG. 21 is a block diagram of a mobile device MBDEV including a memory device MDEV according to an exemplary embodiment of the inventive concept.

Referring to FIG. 21, the mobile device MBDEV according to the exemplary embodiment includes a display unit DSU acting as a user interface, an input unit IU such as a keypad or touch screen for receiving input from a user, a power supply unit PSU for controlling supply of power into the mobile device MBDEV, and a system on-chip SoC. The mobile device MBDEV may be implemented as various devices such as mobile phones, smart phones, audio devices such as MP3 players, notebooks, and table PCs. The mobile device MBDEV may further include components which perform other various functions.

The system on-chip SoC includes a memory device MDEV and/or a memory system MSYS according to one or more exemplary embodiments of the inventive concept. The memory device MDEV includes a write command determination unit, an ECC engine, and a data modulation unit which determine whether or not an applied write command WCMD is a RMW command and perform a write operation in a time or power optimized for the as-determined write command.

Figure 22:
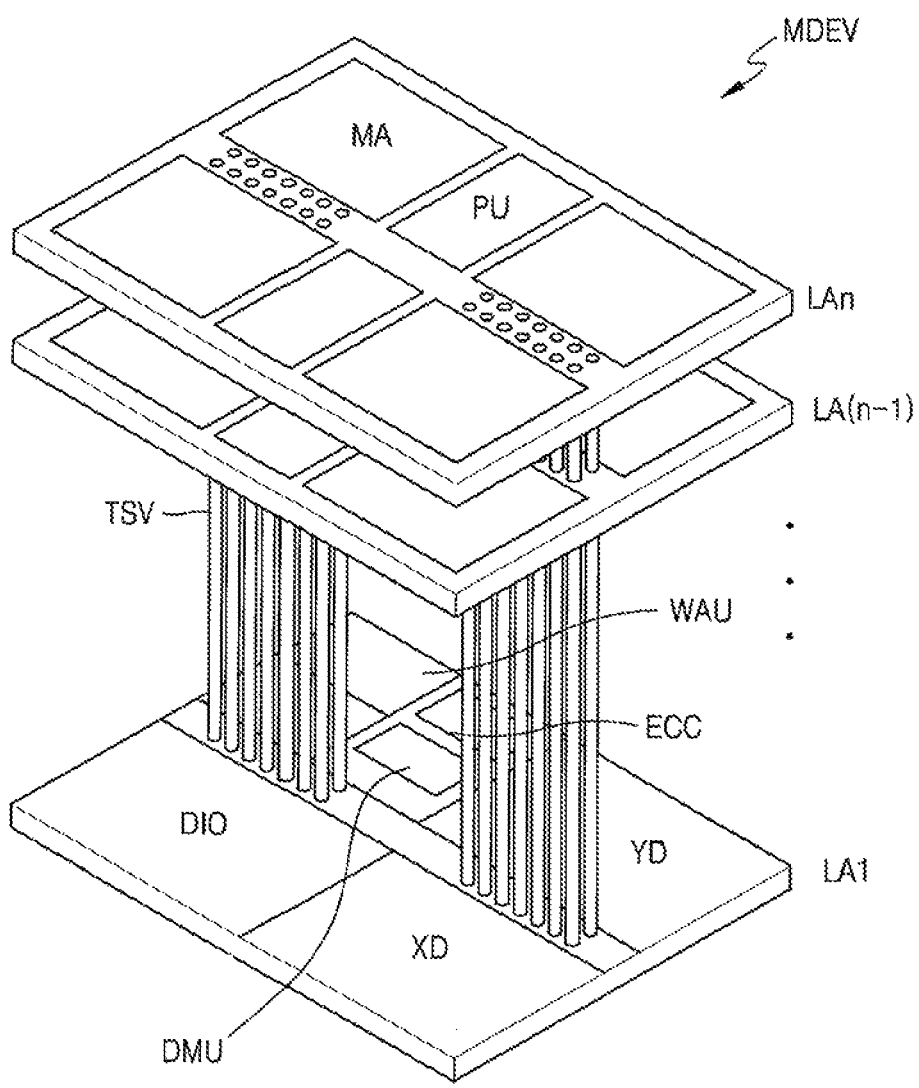
FIG. 22 is a view of a memory device according to an exemplary embodiment of the inventive concept.

FIG. 22 is a view of a memory device MDEV according to an exemplary embodiment of the inventive concept. The memory device MDEV according to the exemplary embodiment has a plurality of semiconductor layers LA1 through LAn stacked therein.

Each of the semiconductor layers LA1 through LAn may be a DRAM chip including DRAM cells. Alternatively, some of the plurality of semiconductor layers LA1 through LAn are master chips for performing interfacing with an external controller while the remaining semiconductor layers may be slave chips comprising at least one memory cell array for storing data. It is assumed herein that the lowermost semiconductor layer LA1 is a master chip, and that the remaining semiconductor layers LA2 through LAn are slave chips.

The plurality of semiconductor layers LA1 through LAn transmit/receive signals between each other by a through silicon via (TSV), and the semiconductor layer LA1 acting as a master chip communicates with the external memory controller through a conductive device (not shown) disposed on an outer surface thereof. The configuration and operation of the memory device MDEV including the first semiconductor layer LA1 as a master chip and the n-th semiconductor layer LAn as a slave chip are now described.

The first semiconductor layer LA1 includes various circuits for driving memory cell arrays MAs mounted on slave chips. For example, the first semiconductor layer LAn may include a row driver (X-Driver: XD) for driving word lines of the cell arrays MAs, a column driver (Y-Driver: YD) for driving bit lines, a data I/O unit DIO for controlling input and output of data, and a write command determination unit WAU. To determine whether or not a write command WCMD applied to the memory device MDEV is a RMW command and to perform a write operation in a time or power optimized for the as-determined write command, the first semiconductor layer LA1 includes the write command determination unit WAU, an ECC engine ECC, and a data modulation unit DMU. Write data or modulation data to be written to the semiconductor layers LA2 through LAn may be provided by the first semiconductor layer LA1 through a TSV.

The n-th semiconductor layer LAn may include a memory cell array MA and a peripheral circuit area PU having peripheral circuits for driving the cell array MA such as a row/column selector for selecting rows and columns of the cell array MA and a bit line sense amplifier (not shown).

Figure 23:
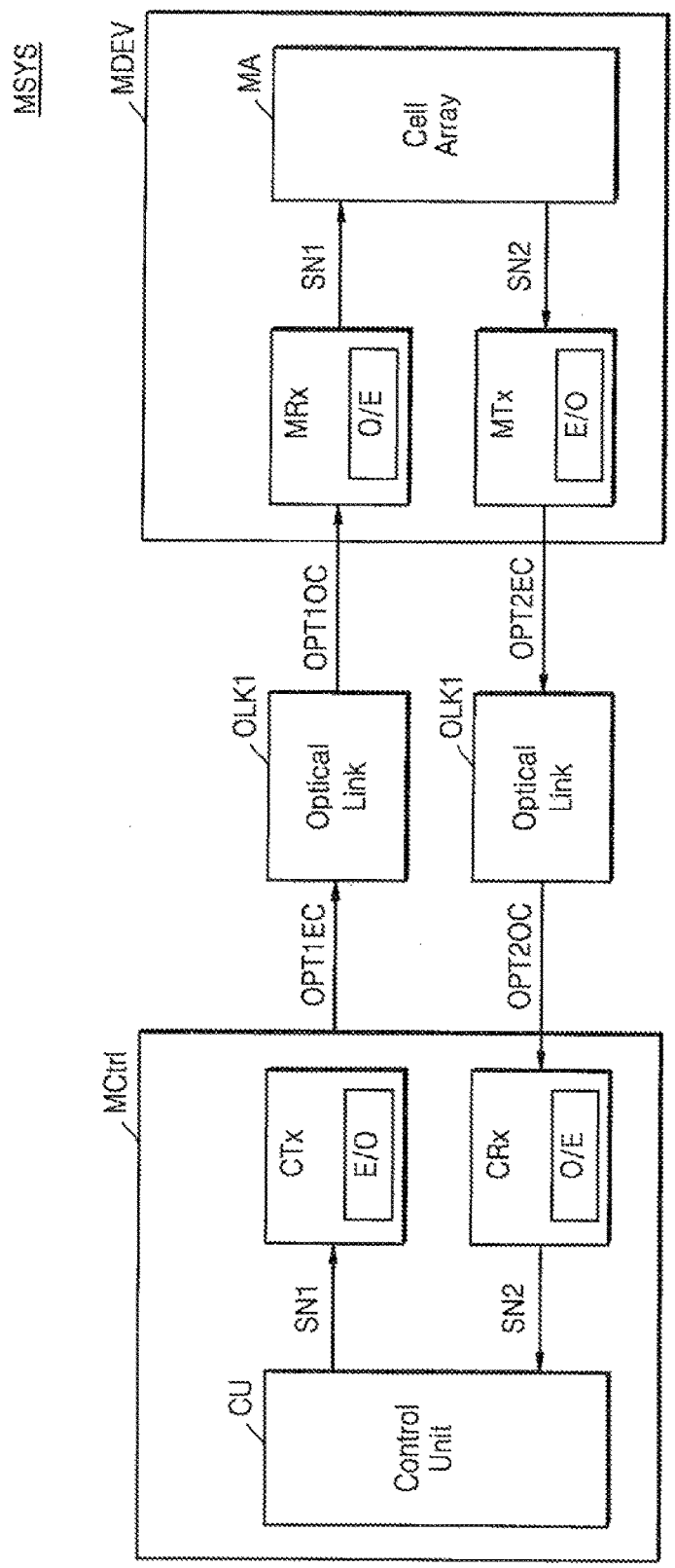
FIG. 23 is a block diagram of a memory system according to an exemplary embodiment of the inventive concept.

FIG. 23 is a block diagram of a memory system MSYS according to an exemplary embodiment of the inventive concept. The memory system MSYS according to an exemplary embodiment of the inventive concept includes optical links OLK1 and OLK2, a memory controller MCtrl, and a memory device MDEV. The memory device MDEV may be a DRAM chip.

The optical links OLK1 and OLK2 interconnect the memory controller MCtrl with the memory device MDEV. The memory controller MCtrl includes a control unit CU, a first transmitter CTx, and a first receiver CRx. The control unit CU transmits a first electrical signal SN1 to the first transmitter CTx. The first electrical signal SN1 may include CA signals, clocking signals, address signals and data which are transmitted to the memory device MDEV.

The first transmitter CTx includes an optical modulator E/O that converts the first electrical signal SN1 into a first optical transmitting signal OTP1EC and transmits the same to the optical link OLK1. The first optical transmitting signal OTP1EC is transmitted via the optical link OLK1 using serial communication. The first receiver CRx includes a first optical demodulator O/E which converts a second optical receiving signal OPT2OC received via the optical link OLK2 into a second electrical signal SN2 and transmits the same to the control unit CU.

The memory device MDEV includes a second receiver MRx, a cell array MA, and a second transmitter MTx. The second receiver MRx includes an optical demodulator O/E which optical demodulator O/E which converts a first optical receiving signal OPT1OC received via the optical link OLK1 into the first electrical signal SN1 and transmits the same to the cell array MA.

The cell array MA writes write data to a memory cell in response to the first electrical signal SN1 or transmits data read from the cell array MA to the second transmitter MTx as a second electrical signal SN2. The second electrical signal SN2 may consist of clocking signals and read data, which are transmitted to the memory controller MCtrl. The second transmitter MTx includes a second optical modulator E/O which converts the second electrical signal SN2 into a second optical transmitting signal OPT2EC and transmits the same to the optical link OLK2. The second optical transmitting signal OPT2EC is transmitted via the optical link OLK2 using serial communication.

Although not shown in FIG. 23, to determine whether or not a write command WCMD applied to the memory device MDEV is a RMW command and perform an operation in a time or power optimized for the as-determined write command, the memory device MDEV includes a write command determination unit WAU, an ECC engine ECC, and a data modulation unit DMU.

Figure 24:
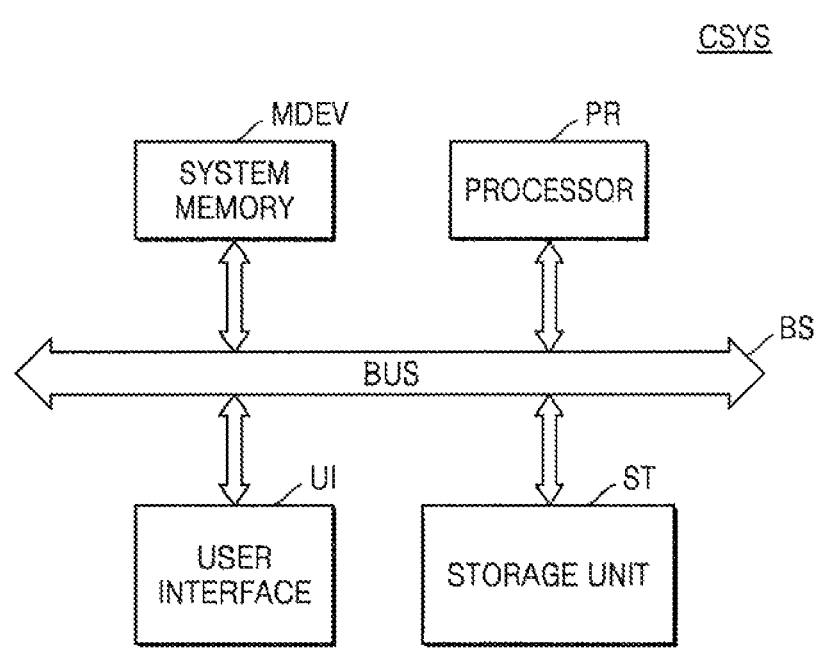
FIG. 24 is a block diagram of a computing system equipped with a memory device according to an exemplary embodiment of the inventive concept.

FIG. 24 is a block diagram of a computing system CSYS equipped with a memory device according to an exemplary embodiment of the inventive concept. According to the exemplary embodiment, the memory device MDEV is a system memory and is built into the computing system CSYS which may be implemented as a mobile equipment or as a laptop or desktop computer. The system memory MDEV has a configuration according to one or more exemplary embodiments of the inventive concept. For example, to determine whether an applied write command WCMD is a RMW command or not, and to perform a write operation in a time or power optimized for the as-determined write command, the system memory MDEV includes a write command determination unit WAU, an ECC engine ECC, and a data modulation unit DMU. Furthermore, the system memory MDEV may include a memory device and a memory controller.

The computing system CYS includes a processor PR, the system memory MDEV, a user interface UI, and a storage unit ST having a nonvolatile memory, which are electrically coupled to a bus BS. The storage unit ST may be a large capacity storage device such as a solid state drive (SSD) or hard disk drive (HDD).

While the inventive concept has been particularly shown and described with reference to exemplary embodiments thereof, it will be understood that various changes in form and details may be made therein without departing from the spirit and scope of the following claims. The scope of the invention is defined not by the detailed description of the exemplary embodiments of the inventive concept but by the appended claims.

What is claimed is:

1. A synchronous dynamic random access memory (SDRAM) device comprising:
    a memory cell array including a plurality of memory cells;
    a clock pin receiving a clock signal;
    a plurality of data pins receiving write data;
    a plurality of command/address pins receiving command/address signals comprising a write command and a write address, wherein the write address indicates a location of the memory cell array for the write data to be written into;
    a data masking pin receiving a data. masking signal, wherein the data masking signal indicates a first portion of the write data to he masked, wherein the first portion of the write data is addressed by the write address to be written into a first portion of the memory cell array;
    a write command determination unit configured to determine whether the write command is a normal write command or a read modify write command, wherein the read modify write command receives the data masking signal along with the write data for masking the first portion of the write data;
    a data modulation unit, wherein if the write command is determined to be the read modify write command, is configured to generate modulation data by reading out first read data from the first portion of the memory cell array and replacing the first portion of write data with the first read data, and the size of the modulation data being equal to the size of the write data,
    wherein the modulation data comprises the first read data combined with a second portion of the write data, and the second portion of the write data is a portion of write data other than the first portion of the write data;
    an error correction. code (ECC) engine configured to generate a parity; and
    a writing unit configured to write at least the second portion of the write data and the parity into the memory cell array if the write command is determined to be the read modify write command.

2. The SDRAM device of claim 1, wherein the writing unit is further configured to write back the first read data into the first portion of the memory cell array.

3. The SDRAM device of claim 1, wherein the data masking signal is inputted in synchronization with receipt of the first portion of the write data to be masked.

4. The SDRAM device of claim 1, further comprising:
    a parity region including a plurality of memory cells,
    wherein a parity of the modulation data is written into the parity region if the write command is determined to be the read modify write command, and a parity of the write data is written into the parity region if the write command is determined to be the normal write command.

5. The SDRAM device of claim 1, wherein the normal write command and the read modify write command are distinguished from each other by at least one of the command/address signals.

6. The SDRAM device of claim 5, wherein the normal write command and the read modify write command are distinguished from each other by keeping at least one of the command/address signals with a logic level low at a rising edge of the clock signal of the write command for the normal write command and with a logic level high at a rising edge of the clock signal of the write command for the read modify write command respectively.

7. The SDRAM device of claim 1, wherein the modulation data has a hit-size corresponding to the smallest encoding unit of the ECC engine.

8. The SDRAM device of claim 1, wherein the SDRAM device, if the write command is determined to be the read modify write command, is configured to enable a first column select signal for reading the first portion of the memory cell array and thereafter to enable a second column select signal for writing at least the second portion of write data into the memory cell array.

9. The SDRAM device of claim 8, wherein the SDRAM device, if the write command is determined to be the read modify write command, is configured to enable a first column select signal for reading the first portion of the memory cell array before receiving the data masking signal.

10. The SDRAM device of claim 8, wherein the SDRAM device, if the write command is determined to be the read modify write command, is further configured to enable a third column select signal for writing a parity of the modulation data into a parity region.

11. The SDRAM device of claim 1, wherein the SDRAM device, if the write command is determined to be the normal write command, is configured to enable both a first column select signal and a second column select signal for writing the first portion of the write data and the second portion of the write data respectively.

12. The SDRAM device of claim 11, wherein the SDRAM device, if the write command is determined to be the normal write command, is further configured to enable a third. column select signal at a same timing with the first and second column select signals for writing a parity of the write data into a parity region.

13. A method of writing data in a synchronous dynamic random access memory (SDRAM) device including an error correction code (ECC) engine, the method comprising:
    receiving command/address signals comprising a write command and a write address;
    receiving data signals comprising write data, wherein the write data is written into a memory cell array of the SDRAM device based on the write command and the write address;
    receiving a data masking signal indicating a first portion of the write data to be masked, wherein the first portion of the write data is addressed by the write address to be written into a first portion of the memory cell array;

determining whether the write command is a read modify write command or a normal write command based on at least one of the command/address signals;

reading the first portion of the memory cell array to produce a first read data if the write command is the read modify write command;

generating modulation data by replacing the first portion of the write data with the first read data, wherein the size of the modulation data is equal to the size of the write data, wherein the modulation data comprises the first read data combined with a second portion of the write data, and the second portion of the write data is a portion of write data other than the first portion of the write data;

encoding a parity of the modulation data by using the ECC engine; and writing at least the second portion of the write data and the parity of the modulation data into the memory cell array and a parity region respectively if the write command is determined to be the read modify write command, wherein, if the write command is determined to be the read modify write command, at least the second portion of the write data is written into the memory cell array after the data masking signal is received.

14. The method of claim 13, wherein the method further includes writing back the first read data into the first portion of the memory cell array.

15. The method of claim 13, wherein the data masking signal is inputted in synchronization with receipt of the first portion of the write data to be masked.

16. The method of claim 13, wherein the method further includes generating a parity of the write data if the write command is the normal write command.

17. The method of claim 13, wherein the method further includes writing the write data and the parity of the write data into the memory cell array and the parity region respectively if the write command is the normal write command.

18. The method of claim 13, wherein the modulation data has a bit-size corresponding to the smallest encoding unit of the ECC engine.

19. The method of claim 13, wherein executing the read modify write command comprises enabling a first column select signal for reading the first portion of the memory cell array and thereafter enabling a second column select signal for writing the second portion of write data into the memory cell array.

20. The method of claim 19, further comprising enabling a first column select signal for reading the first portion of the memory cell array before receiving the data masking signal.

21. The method of claim 19, wherein writing the parity of the modulation data into the parity region comprises enabling a third column select signal.

22. The method of claim 13, wherein the method further includes executing the normal write command by enabling both a first column select signal and a second column select signal for writing the write data.

23. The SDRAM device of claim 1, wherein, if the write command is determined to be the read modify write command, the writing unit writes at least the second portion of the write data when the SDRAM device receives the data masking signal.

24. The SDRAM device of claim 4, wherein the writing unit is further configured to write the write data and the parity of the write data into the memory cell array and the parity region respectively if the write command is determined to be the normal write command.

* * * * *